(12) United States Patent
Zhang et al.

(10) Patent No.: US 11,917,753 B2
(45) Date of Patent: Feb. 27, 2024

(54) CIRCUIT BOARD FOR USE AT 5G FREQUENCIES

(71) Applicant: Ticona LLC, Florence, KY (US)

(72) Inventors: Xiaowei Zhang, Union, KY (US);
Xinyu Zhao, Cincinnati, OH (US);
Christopher McGrady, Walton, KY (US)

(73) Assignee: Ticona LLC, Florence, KY (US)

( * ) Notice: Subject to any disclaimer, the term of this patent is extended or adjusted under 35 U.S.C. 154(b) by 604 days.

(21) Appl. No.: 16/995,899

(22) Filed: Aug. 18, 2020

(65) Prior Publication Data

US 2021/0092836 A1     Mar. 25, 2021

Related U.S. Application Data

(60) Provisional application No. 63/024,568, filed on May 14, 2020, provisional application No. 63/009,001, (Continued)

(51) Int. Cl.
*H05K 1/02* (2006.01)
*H05K 1/09* (2006.01)
(Continued)

(52) U.S. Cl.
CPC ........... *H05K 1/0353* (2013.01); *B32B 15/09* (2013.01); *B32B 15/20* (2013.01); *C08G 63/605* (2013.01);
(Continued)

(58) Field of Classification Search
CPC ...... H05K 1/024; H05K 1/036; H05K 1/0242; H05K 1/0353; H05K 1/0366; H05K 1/0373; H05K 1/09; H05K 1/111; H05K 1/115; H05K 1/116; H05K 3/0073; H05K 3/362; H05K 3/388; H05K 3/4632; H05K 3/4685; H05K 2201/015; H05K 2201/0141;
(Continued)

(56) References Cited

U.S. PATENT DOCUMENTS 4,161,470 A   7/1979   Calundann
4,162,466 A   7/1979   Hunsinger et al.
(Continued)

FOREIGN PATENT DOCUMENTS

CN   101429342 A   5/2009
CN   101445666 A   6/2009
(Continued)

OTHER PUBLICATIONS

Amato, Ing. Francesco, Ph.D., "A Primer on 5G," Jan. 11, 2019, 19 pages.
(Continued)

*Primary Examiner* — Xiaoliang Chen
(74) *Attorney, Agent, or Firm* — Dority & Manning, P.A.

(57) ABSTRACT

A laminate for use in a circuit board is provided. The laminate comprises a conductive layer and a film positioned adjacent to the conductive layer. The film comprises a polymer composition that includes a liquid crystalline polymer and a hydrophobic material. The polymer composition exhibits a dielectric constant of about 5 or less and dissipation factor of about 0.05 or less at a frequency of 10 GHz.

37 Claims, 8 Drawing Sheets

Related U.S. Application Data filed on Apr. 13, 2020, provisional application No. 62/994,324, filed on Mar. 25, 2020, provisional application No. 62/986,098, filed on Mar. 6, 2020, provisional application No. 62/904,099, filed on Sep. 23, 2019.

(51) Int. Cl.

| | | |
|---|---|---|
| *C08L 67/00* | (2006.01) | |
| *C08L 67/02* | (2006.01) | |
| *C08L 67/04* | (2006.01) | |
| *C08L 71/00* | (2006.01) | |
| *C08L 71/08* | (2006.01) | |
| *H05K 1/03* | (2006.01) | |
| *C08G 63/60* | (2006.01) | |
| *H01Q 1/24* | (2006.01) | |
| *B32B 15/09* | (2006.01) | |
| *B32B 15/20* | (2006.01) | |
| *H01Q 21/06* | (2006.01) | |

(52) U.S. Cl.
CPC .............. *C08L 67/04* (2013.01); *H01Q 1/243* (2013.01); *H05K 1/09* (2013.01); *B32B 2307/202* (2013.01); *B32B 2307/204* (2013.01); *B32B 2307/73* (2013.01); *B32B 2457/08* (2013.01); *C08G 2250/00* (2013.01); *C08L 2203/16* (2013.01); *C08L 2203/20* (2013.01); *C08L 2205/14* (2013.01); *H01Q 21/065* (2013.01); *H05K 2201/015* (2013.01); *H05K 2201/0141* (2013.01); *H05K 2201/10098* (2013.01); *H05K 2201/10522* (2013.01)

(58) Field of Classification Search
CPC .......... H05K 2201/10098; H05K 2201/10522; C08G 63/605; C08G 2250/00; C08L 67/00; C08L 67/02; C08L 67/04; C08L 71/00; C08L 71/08; C08L 71/123; C08L 2203/16; C08L 2203/20; C08L 2205/14
USPC ................ 174/256, 257, 258, 262; 523/100; 525/397, 425; 343/787; 428/213, 422, 428/457, 458, 462, 473.5, 480, 521, 523, 428/693
See application file for complete search history.

(56) References Cited

U.S. PATENT DOCUMENTS

| | | | |
|---|---|---|---|
| 4,458,039 A | 7/1984 | Eickman | |
| 4,708,629 A | 11/1987 | Kasamatsu | |
| 4,746,694 A | 5/1988 | Charbonneau et al. | |
| 4,960,654 A | 10/1990 | Yoshinaka et al. | |
| 4,968,539 A * | 11/1990 | Aoyagi | B01D 69/141 |
| | | | 428/913 |
| 5,032,627 A | 7/1991 | Wilson et al. | |
| 5,348,990 A | 9/1994 | Walpita et al. | |
| 5,541,240 A | 7/1996 | Makhija et al. | |
| 5,616,680 A | 4/1997 | Linstid, III | |
| 5,624,984 A | 4/1997 | Furuta et al. | |
| 5,663,376 A | 9/1997 | Yoneta et al. | |
| 5,767,195 A | 6/1998 | Furuta et al. | |
| 6,051,175 A * | 4/2000 | Kurihara | D04H 3/02 |
| | | | 264/210.8 |
| 6,114,492 A | 9/2000 | Linstid, III et al. | |
| 6,121,369 A | 9/2000 | Stack et al. | |
| 6,303,524 B1 | 10/2001 | Sharangpani et al. | |
| 6,346,864 B1 | 2/2002 | Kadota | |
| 6,350,822 B1 | 2/2002 | Van Diepen et al. | |
| 6,489,928 B2 | 12/2002 | Sakurada | |
| 6,495,616 B2 | 12/2002 | Maeda | |
| 6,514,611 B1 | 2/2003 | Shepherd et al. | |
| 6,635,605 B1 * | 10/2003 | Como | H01T 13/06 |
| | | | 508/183 |
| 6,641,928 B2 | 11/2003 | Takeichi et al. | |
| 6,756,427 B2 | 6/2004 | Maeda | |
| 6,818,821 B2 | 11/2004 | Fujieda et al. | |
| 6,894,141 B2 | 5/2005 | Satoh et al. | |
| 6,984,712 B2 | 1/2006 | Ueno et al. | |
| 6,994,896 B2 * | 2/2006 | Sethumadhavan | B32B 27/12 |
| | | | 428/209 |
| 7,014,921 B2 | 3/2006 | Okamoto et al. | |
| 7,063,892 B2 | 6/2006 | Okamoto et al. | |
| 7,079,405 B2 | 7/2006 | Tobita et al. | |
| 7,148,311 B2 | 12/2006 | Benicewicz et al. | |
| 7,180,172 B2 | 2/2007 | Sethumadhaven et al. | |
| 7,223,807 B2 | 5/2007 | Okamoto et al. | |
| 7,239,261 B2 | 7/2007 | Fujieda et al. | |
| 7,247,590 B2 | 7/2007 | Kawabata et al. | |
| 7,314,898 B2 | 1/2008 | Downing, Jr. et al. | |
| 7,439,200 B2 | 10/2008 | Lee et al. | |
| 7,455,901 B2 | 11/2008 | Yano et al. | |
| 7,504,150 B2 | 3/2009 | Lee et al. | |
| 7,531,204 B2 | 5/2009 | Lee et al. | |
| 7,547,849 B2 | 6/2009 | Lee et al. | |
| 7,583,226 B2 | 9/2009 | Sakurada | |
| 7,618,553 B2 | 11/2009 | Kim et al. | |
| 7,648,758 B2 | 1/2010 | Morin | |
| 7,704,408 B2 | 5/2010 | Fuksatu | |
| 7,713,439 B2 | 5/2010 | Murouchi et al. | |
| 7,737,198 B2 | 6/2010 | Murouchi et al. | |
| 7,790,786 B2 | 9/2010 | Murouchi et al. | |
| 7,816,014 B2 | 10/2010 | Ito et al. | |
| 7,897,083 B2 | 3/2011 | Fukatsu et al. | |
| 7,985,351 B2 | 7/2011 | Yamauchi et al. | |
| 8,012,352 B1 | 9/2011 | Giraldo et al. | |
| 8,025,814 B2 | 9/2011 | Uehara et al. | |
| 8,043,527 B2 | 10/2011 | Iwase et al. | |
| 8,044,151 B2 | 10/2011 | Asahara et al. | |
| 8,066,907 B2 | 11/2011 | Kohinata et al. | |
| 8,192,645 B2 | 6/2012 | Murouchi et al. | |
| 8,222,802 B2 | 7/2012 | Saito et al. | |
| 8,226,851 B2 | 7/2012 | Harada et al. | |
| 8,231,807 B2 | 7/2012 | Yonezawa et al. | |
| 8,309,640 B2 | 11/2012 | Li et al. | |
| 8,337,719 B2 | 12/2012 | Hosoda et al. | |
| 8,425,798 B2 | 4/2013 | Saito et al. | |
| 8,475,924 B2 | 7/2013 | Lee et al. | |
| 8,492,464 B2 | 7/2013 | Li et al. | |
| 8,545,718 B2 | 10/2013 | Nakayama et al. | |
| 8,580,145 B2 | 11/2013 | Osato et al. | |
| 8,641,924 B2 | 2/2014 | Sekimura et al. | |
| 8,642,682 B2 | 2/2014 | Nishihata | |
| 8,692,272 B2 | 4/2014 | Matsumi et al. | |
| 8,703,011 B2 | 4/2014 | Wang et al. | |
| 8,715,526 B2 | 5/2014 | Kitai et al. | |
| 8,816,019 B2 | 8/2014 | Ganguly et al. | |
| 8,841,367 B2 | 9/2014 | Zheng et al. | |
| 8,883,900 B2 | 11/2014 | Jiang et al. | |
| 8,894,880 B2 | 11/2014 | Shin et al. | |
| 8,895,649 B2 | 11/2014 | Li et al. | |
| 8,926,862 B2 | 1/2015 | Kim et al. | |
| 8,927,661 B2 | 1/2015 | Li et al. | |
| 8,946,333 B2 | 2/2015 | Raman et al. | |
| 8,992,805 B2 | 3/2015 | Nishimura et al. | |
| 9,018,286 B2 | 4/2015 | Daga et al. | |
| 9,023,923 B2 | 5/2015 | An et al. | |
| 9,074,070 B2 | 7/2015 | Yung et al. | |
| 9,156,973 B2 | 10/2015 | Supriya et al. | |
| 9,178,281 B2 | 11/2015 | Kasai | |
| 9,185,800 B2 | 11/2015 | Meng et al. | |
| 9,234,092 B2 | 1/2016 | Nakayama et al. | |
| 9,258,892 B2 | 2/2016 | Crosley | |
| 9,283,707 B2 | 3/2016 | Saito et al. | |
| 9,355,753 B2 | 5/2016 | Kim | |
| 9,394,483 B2 | 7/2016 | Wu et al. | |
| 9,538,646 B2 | 1/2017 | Onodera et al. | |
| 9,574,065 B2 | 2/2017 | Miyamoto et al. | |
| 9,850,343 B2 | 12/2017 | Konishi et al. | |
| 9,896,566 B2 | 2/2018 | Yung et al. | |

(56) References Cited

U.S. PATENT DOCUMENTS

| | | | |
|---|---|---|---|
| 9,944,768 B2 | 4/2018 | Cheng et al. | |
| 9,982,113 B2 | 5/2018 | Kniess et al. | |
| 10,106,682 B2 | 10/2018 | Kim | |
| 10,119,021 B2 | 11/2018 | Li et al. | |
| 10,150,863 B2 | 12/2018 | Wu et al. | |
| 10,174,180 B2 | 1/2019 | Bao et al. | |
| 10,233,301 B2 | 3/2019 | Kato et al. | |
| 10,273,362 B2 | 4/2019 | Zhang et al. | |
| 10,290,389 B2 | 5/2019 | Wu et al. | |
| 10,329,422 B2 | 6/2019 | Li et al. | |
| 10,492,306 B2 | 11/2019 | Takahashi et al. | |
| 10,604,649 B2 | 3/2020 | Yamanaka | |
| 10,696,787 B2 | 6/2020 | Takasuka et al. | |
| 10,697,065 B2 | 6/2020 | Hua et al. | |
| 10,714,810 B2 | 7/2020 | Hong et al. | |
| 10,741,932 B2 | 8/2020 | Thai et al. | |
| 10,767,049 B2 | 9/2020 | Kim | |
| 10,784,030 B2 | 9/2020 | Lee et al. | |
| 10,807,352 B2 | 10/2020 | Nakashima et al. | |
| 10,822,452 B2 | 11/2020 | Tsuchiya et al. | |
| 10,822,453 B2 | 11/2020 | Washino | |
| 10,899,900 B2 | 1/2021 | Jung et al. | |
| 10,968,311 B2 | 4/2021 | Washino | |
| 10,968,347 B2 | 4/2021 | Akiyama et al. | |
| 10,987,911 B2 | 4/2021 | Nakashima et al. | |
| 11,028,250 B2 | 6/2021 | Zhang et al. | |
| 11,052,638 B2 | 7/2021 | Hiramatsu et al. | |
| 11,075,442 B2 | 7/2021 | Wang et al. | |
| 11,505,647 B2 | 11/2022 | Washino | |
| 11,674,083 B2 | 6/2023 | Konno et al. | |
| 2004/0124405 A1* | 7/2004 | Sethumadhavan | B32B 27/365 257/1 |
| 2004/0165390 A1 | 8/2004 | Sato et al. | |
| 2005/0130447 A1 | 6/2005 | Takaya et al. | |
| 2007/0010647 A1 | 1/2007 | Ueno et al. | |
| 2007/0057236 A1 | 3/2007 | Hosoda et al. | |
| 2010/0012354 A1 | 1/2010 | Hedin et al. | |
| 2010/0051999 A1 | 3/2010 | Iwase et al. | |
| 2010/0053972 A1 | 3/2010 | Nakayama | |
| 2010/0263919 A1 | 10/2010 | Lee et al. | |
| 2010/0327728 A1 | 12/2010 | Saito et al. | |
| 2012/0040128 A1 | 2/2012 | Finn | |
| 2012/0276390 A1 | 11/2012 | Ji et al. | |
| 2013/0085220 A1* | 4/2013 | Supriya | C08L 27/18 525/190 |
| 2014/0060899 A1 | 3/2014 | Park et al. | |
| 2014/0128545 A1 | 5/2014 | Xiong et al. | |
| 2014/0142571 A1 | 5/2014 | Yung et al. | |
| 2014/0159285 A1 | 6/2014 | Choi | |
| 2014/0171567 A1 | 6/2014 | Guo et al. | |
| 2014/0296411 A1 | 10/2014 | Cheng et al. | |
| 2014/0311937 A1* | 10/2014 | Adam | C09K 19/3852 220/359.4 |
| 2014/0353543 A1 | 12/2014 | Wu et al. | |
| 2015/0210836 A1* | 7/2015 | Tyler | C09K 19/3809 523/100 |
| 2015/0337132 A1 | 11/2015 | Van der Burgt | |
| 2016/0053106 A1* | 2/2016 | Mazahir | C08G 63/605 525/397 |
| 2016/0053107 A1* | 2/2016 | Mazahir | C09K 19/542 525/397 |
| 2016/0053117 A1* | 2/2016 | Nair | C08G 73/1071 525/425 |
| 2016/0099498 A1* | 4/2016 | Pance | H05K 1/024 428/458 |
| 2016/0116948 A1 | 4/2016 | Ou et al. | |
| 2016/0174364 A1* | 6/2016 | Harkness, Jr. | H05K 1/111 174/262 |
| 2016/0301141 A1 | 10/2016 | Del Castillo et al. | |
| 2017/0002137 A1* | 1/2017 | Nair | C08G 63/605 |
| 2017/0002193 A1 | 1/2017 | Cheng et al. | |
| 2017/0273179 A1 | 9/2017 | Kim | |
| 2017/0361584 A1 | 12/2017 | Feng et al. | |
| 2017/0362731 A1 | 12/2017 | Wang et al. | |
| 2017/0367182 A1 | 12/2017 | Wu et al. | |
| 2018/0215894 A1 | 8/2018 | Cheng et al. | |
| 2018/0230294 A1 | 8/2018 | Cheng et al. | |
| 2018/0332710 A1 | 11/2018 | Lin et al. | |
| 2018/0346711 A1 | 12/2018 | Van der Burgt et al. | |
| 2018/0355150 A1 | 12/2018 | Kim | |
| 2018/0362758 A1 | 12/2018 | Wu et al. | |
| 2019/0027813 A1 | 1/2019 | Wang | |
| 2019/0031879 A1 | 1/2019 | Ding et al. | |
| 2019/0153216 A1 | 5/2019 | Gong et al. | |
| 2019/0237851 A1 | 8/2019 | Gu | |
| 2019/0269012 A1 | 8/2019 | Van der Burgt | |
| 2019/0322861 A1 | 10/2019 | Wei et al. | |
| 2019/0341696 A1 | 11/2019 | O'Connor et al. | |
| 2019/0352501 A1 | 11/2019 | Wang et al. | |
| 2019/0352503 A1 | 11/2019 | Cheng et al. | |
| 2020/0017769 A1 | 1/2020 | Konno et al. | |
| 2020/0022264 A1 | 1/2020 | Cheng et al. | |
| 2020/0031098 A1 | 1/2020 | Nakashima et al. | |
| 2020/0040133 A1 | 2/2020 | Washino | |
| 2020/0048553 A1 | 2/2020 | Hu et al. | |
| 2020/0076035 A1 | 3/2020 | Huh et al. | |
| 2020/0091608 A1 | 3/2020 | Alpman et al. | |
| 2020/0219861 A1 | 7/2020 | Kamgaing et al. | |
| 2020/0299582 A1 | 9/2020 | Komatsu | |
| 2020/0308487 A1 | 10/2020 | Hegi | |
| 2020/0347224 A1 | 11/2020 | Hara | |
| 2020/0369884 A1 | 11/2020 | Lee et al. | |
| 2020/0399465 A1 | 12/2020 | Hara | |
| 2021/0002507 A1 | 1/2021 | Azami et al. | |
| 2021/0024687 A1 | 1/2021 | Ohtomo et al. | |
| 2021/0024701 A1 | 1/2021 | Wang et al. | |
| 2021/0054190 A1 | 2/2021 | Kim | |
| 2021/0057811 A1 | 2/2021 | Kim | |
| 2021/0057827 A1 | 2/2021 | Kim et al. | |
| 2021/0061948 A1 | 3/2021 | Kohinata | |
| 2021/0070927 A1 | 3/2021 | Zhang et al. | |
| 2021/0070929 A1 | 3/2021 | Kim et al. | |
| 2021/0070983 A1 | 3/2021 | Kim et al. | |
| 2021/0075093 A1 | 3/2021 | Zhang et al. | |
| 2021/0075162 A1 | 3/2021 | Kim et al. | |
| 2021/0091818 A1 | 3/2021 | Zhang et al. | |
| 2021/0130585 A1 | 5/2021 | Wang et al. | |
| 2021/0130604 A1 | 5/2021 | Ramakrishnan et al. | |
| 2021/0143539 A1 | 5/2021 | Yuan et al. | |
| 2021/0197527 A1 | 7/2021 | Sunamoto et al. | |
| 2021/0251074 A1 | 8/2021 | Onodera et al. | |
| 2021/0269588 A1 | 9/2021 | Washino | |
| 2021/0274652 A1 | 9/2021 | Kim | |
| 2021/0292475 A1 | 9/2021 | Konishi et al. | |
| 2021/0407704 A1* | 12/2021 | Tsai | H01B 7/0838 |
| 2022/0073732 A1 | 3/2022 | Washino | |

FOREIGN PATENT DOCUMENTS

| | | |
|---|---|---|
| CN | 101831124 A | 9/2010 |
| CN | 104961916 A | 10/2015 |
| CN | 104961922 A | 10/2015 |
| CN | 105504247 A | 4/2016 |
| CN | 105504697 A | 4/2016 |
| CN | 105542135 A | 5/2016 |
| CN | 105542136 A | 5/2016 |
| CN | 105542408 A | 5/2016 |
| CN | 105566868 A | 5/2016 |
| CN | 105585828 A | 5/2016 |
| CN | 105801826 A | 7/2016 |
| CN | 105837805 A | 8/2016 |
| CN | 105860035 B | 8/2016 |
| CN | 105860037 A | 8/2016 |
| CN | 105837803 B | 5/2017 |
| CN | 106633680 A | 5/2017 |
| CN | 106633706 A | 5/2017 |
| CN | 106633859 A | 5/2017 |
| CN | 106675021 A | 5/2017 |
| CN | 107022171 A | 8/2017 |
| CN | 105623206 B | 12/2017 |
| CN | 108045022 A | 5/2018 |
| CN | 108102314 A | 6/2018 |
| CN | 108178906 A | 6/2018 |

(56) References Cited

FOREIGN PATENT DOCUMENTS

| | | |
|---|---|---|
| CN | 108250692 A | 7/2018 |
| CN | 207772540 U | 8/2018 |
| CN | 105837808 B | 9/2018 |
| CN | 105860036 B | 9/2018 |
| CN | 108148433 A | 12/2018 |
| CN | 109301507 A | 2/2019 |
| CN | 105837804 B | 3/2019 |
| CN | 105837807 B | 3/2019 |
| CN | 109467643 A | 3/2019 |
| CN | 109467722 A | 3/2019 |
| CN | 109509975 A | 3/2019 |
| CN | 208675597 U | 3/2019 |
| CN | 106633860 B | 4/2019 |
| CN | 106750198 B | 5/2019 |
| CN | 109705322 A | 5/2019 |
| CN | 109734891 A | 5/2019 |
| CN | 109735060 A | 5/2019 |
| CN | 109742534 A | 5/2019 |
| CN | 109749066 A | 5/2019 |
| CN | 109755729 A | 5/2019 |
| CN | 109755733 A | 5/2019 |
| CN | 109790361 A | 5/2019 |
| CN | 109824876 A | 5/2019 |
| CN | 208904227 U | 5/2019 |
| CN | 110050515 A | 7/2019 |
| CN | 110154464 A | 8/2019 |
| CN | 209266563 U | 8/2019 |
| CN | 209266570 U | 8/2019 |
| CN | 209266571 U | 8/2019 |
| CN | 105837806 B | 9/2019 |
| CN | 108884329 B | 10/2019 |
| CN | 209516005 U | 10/2019 |
| CN | 209544599 U | 10/2019 |
| CN | 110437641 A | 11/2019 |
| CN | 110505753 A | 11/2019 |
| CN | 110746754 A | 2/2020 |
| CN | 110769594 A | 2/2020 |
| CN | 110177821 B | 3/2020 |
| CN | 110903612 A | 3/2020 |
| CN | 111087765 A | 5/2020 |
| CN | 111087797 A | 5/2020 |
| CN | 111117169 A | 5/2020 |
| CN | 111286176 A | 6/2020 |
| CN | 111320848 A | 6/2020 |
| CN | 210706390 U | 6/2020 |
| CN | 111393806 A | 7/2020 |
| CN | 110603278 B | 2/2021 |
| CN | 109705322 B | 9/2021 |
| CN | 109661433 B | 5/2022 |
| CN | 111936547 B | 5/2022 |
| EP | 1 052 272 A2 | 11/2000 |
| EP | 2 774 952 B1 | 9/2014 |
| EP | 2 981 573 B1 | 6/2018 |
| EP | 3 674 080 A1 | 7/2020 |
| EP | 3 674 368 A1 | 7/2020 |
| EP | 3 730 545 A1 | 10/2020 |
| JP | S 63230756 A | 9/1988 |
| JP | H 0395259 A | 4/1991 |
| JP | H 044295 A | 1/1992 |
| JP | H 05105804 A | 4/1993 |
| JP | H 0812863 A | 1/1996 |
| JP | H 0967575 A | 3/1997 |
| JP | H 1025402 A | 1/1998 |
| JP | 2001026699 A | 1/2001 |
| JP | 2003113314 A | 4/2003 |
| JP | 2003171538 A | 6/2003 |
| JP | 2003268089 A | 9/2003 |
| JP | 2003268241 A | 9/2003 |
| JP | 2004143270 A | 5/2004 |
| JP | 2004277539 A | 10/2004 |
| JP | 2004323705 A | 11/2004 |
| JP | 2005029649 A | 2/2005 |
| JP | 2005078806 A | 3/2005 |
| JP | 4945097 B2 | 1/2007 |
| JP | 2007118528 A | 5/2007 |
| JP | 2007154169 A | 6/2007 |
| JP | 2007273537 A | 10/2007 |
| JP | 2009114418 A | 5/2009 |
| JP | 4339966 B2 | 10/2009 |
| JP | 4475977 B2 | 6/2010 |
| JP | 2010254875 A | 11/2010 |
| JP | 2011052037 A | 3/2011 |
| JP | 2011093973 A | 5/2011 |
| JP | 2013108008 A | 6/2013 |
| JP | 5280281 B2 | 9/2013 |
| JP | 5332081 B2 | 11/2013 |
| JP | 2015059178 A | 3/2015 |
| JP | 2015178598 A | 10/2015 |
| JP | 6088620 B2 | 1/2016 |
| JP | 5866423 B2 | 2/2016 |
| JP | 6470295 B2 | 2/2016 |
| JP | 2016041828 A | 3/2016 |
| JP | 2016042540 A | 3/2016 |
| JP | 5919613 B2 | 5/2016 |
| JP | 5924527 B2 | 5/2016 |
| JP | 2016088985 A | 5/2016 |
| JP | 2016107507 A | 6/2016 |
| JP | 2016147985 A | 8/2016 |
| JP | 2017014357 A | 1/2017 |
| JP | 2017043705 A | 3/2017 |
| JP | 6302581 B2 | 5/2017 |
| JP | 2017095625 A | 6/2017 |
| JP | 2017119378 A | 7/2017 |
| JP | 2017120826 A | 7/2017 |
| JP | 6177191 B2 | 8/2017 |
| JP | 6181587 B2 | 8/2017 |
| JP | 2017179127 A | 10/2017 |
| JP | 2018012789 A | 1/2018 |
| JP | 2018016753 A | 2/2018 |
| JP | 2018016754 A | 2/2018 |
| JP | 2018029187 A | 2/2018 |
| JP | 6295013 B2 | 3/2018 |
| JP | 2018030948 A | 3/2018 |
| JP | 6306369 B2 | 4/2018 |
| JP | 6306369 B2 | 4/2018 |
| JP | 6316178 B2 | 4/2018 |
| JP | 6316733 B2 | 4/2018 |
| JP | 6335175 B2 | 5/2018 |
| JP | 6359225 B2 | 7/2018 |
| JP | 2018109090 A | 7/2018 |
| JP | 2018110193 A | 7/2018 |
| JP | 6389484 B2 | 9/2018 |
| JP | 6405817 B2 | 10/2018 |
| JP | 6405818 B2 | 10/2018 |
| JP | 2018160636 A | 10/2018 |
| JP | 2018160637 A | 10/2018 |
| JP | 2018160638 A | 10/2018 |
| JP | 2018160639 A | 10/2018 |
| JP | 6426994 B2 | 11/2018 |
| JP | 2018168320 A | 11/2018 |
| JP | 6443927 B2 | 12/2018 |
| JP | 2019006973 A | 1/2019 |
| JP | 2019014787 A | 1/2019 |
| JP | 6470295 B2 | 2/2019 |
| JP | 6474261 B2 | 2/2019 |
| JP | 6480289 B2 | 3/2019 |
| JP | 2019065263 A | 4/2019 |
| JP | 6533880 B1 | 6/2019 |
| JP | 6533881 B1 | 6/2019 |
| JP | 2019094489 A | 6/2019 |
| JP | 2019094497 A | 6/2019 |
| JP | 2019096845 A | 6/2019 |
| JP | 2019099618 A | 6/2019 |
| JP | 2019106434 A | 6/2019 |
| JP | 2019116586 A | 7/2019 |
| JP | 2019127556 A | 8/2019 |
| JP | 2019127557 A | 8/2019 |
| JP | 2019134053 A | 8/2019 |
| JP | 6574281 B2 | 9/2019 |
| JP | 6574281 B2 | 9/2019 |
| JP | 6576754 B2 | 9/2019 |
| JP | 6576754 B2 | 9/2019 |
| JP | 6576802 B2 | 9/2019 |
| JP | 6576808 B2 | 9/2019 |

(56) References Cited

FOREIGN PATENT DOCUMENTS

| | | |
|---|---|---|
| JP | 2019147913 A | 9/2019 |
| JP | 2019161206 A | 9/2019 |
| JP | 2019183040 A | 10/2019 |
| JP | 2019183041 A | 10/2019 |
| JP | 2019189734 A | 10/2019 |
| JP | 2019189735 A | 10/2019 |
| JP | 2019189736 A | 10/2019 |
| JP | 2019189737 A | 10/2019 |
| JP | 6626358 B2 | 12/2019 |
| JP | 6644542 B2 | 2/2020 |
| JP | 6652223 B1 | 2/2020 |
| JP | 6773824 B2 | 10/2020 |
| JP | 6837189 B1 | 3/2021 |
| JP | 6854124 B2 | 4/2021 |
| JP | 6900151 B2 | 7/2021 |
| JP | 6930784 B2 | 9/2021 |
| JP | 6998189 B2 | 1/2022 |
| JP | 7116546 B2 | 8/2022 |
| KR | 20140074094 A | 6/2014 |
| KR | 20140074095 A | 6/2014 |
| KR | 101757308 B1 | 7/2017 |
| KR | 101792873 B1 | 11/2017 |
| KR | 101817365 B1 | 1/2018 |
| KR | 101817366 B1 | 1/2018 |
| KR | 101834703 B1 | 3/2018 |
| KR | 102104752 B1 | 4/2020 |
| KR | 102104753 B1 | 4/2020 |
| KR | 20200070501 A | 6/2020 |
| KR | 102167337 B1 | 10/2020 |
| TW | 201831712 A | 9/2018 |
| WO | WO 01/04190 A1 | 1/2001 |
| WO | WO 2004/058851 A1 | 7/2004 |
| WO | WO 2020/194196 A1 | 10/2010 |
| WO | WO 2014/162254 A1 | 10/2014 |
| WO | WO 2014/180550 A1 | 11/2014 |
| WO | WO 2014/203227 A2 | 12/2014 |
| WO | WO 2016/174868 A1 | 11/2016 |
| WO | WO 2017/029608 A1 | 2/2017 |
| WO | WO 2018/026601 A1 | 2/2018 |
| WO | WO 2018/038093 A1 | 3/2018 |
| WO | WO 2018/056294 A1 | 3/2018 |
| WO | WO 2018/141769 A1 | 8/2018 |
| WO | WO 2019/042906 A1 | 3/2019 |
| WO | WO 2019/213920 A1 | 11/2019 |
| WO | WO 2020/095997 A1 | 5/2020 |
| WO | WO 2020/217225 A1 | 10/2020 |

OTHER PUBLICATIONS

Bjornson, Emil, "Massive MIMO for 5G," Tutorial at 2015 IEEE International Workshop on Signal Processing Advances in Wireless Communications, (SPAWC), Jun. 29, Stockholm, Sweden 58 pages.
Paper—John Coonrod, "High Frequency Circuit Materials Attributes," *Rogers Corporation*, 15 pages.
Hassan et al., Massive MIMO Wireless Networks: An Overview, *Electronics*, 2017, 6, 63, pp. 1-29.
Jilani et al., "Millimeter-wave Liquid Crystal Polymer Based Antenna Array for Conformal 5G Applications," *IEEE Antennas and Wireless Propagation Letters*, vol. 18, Issue 1, Jan. 2019, pp. 84-88.
Paper—The Fifth Generation of Wireless Network Communications from TE Connectivity, Apr. 2019, 20 pages.
Paper—Material Solutions for 5G Applications from SABIC, 2018, 4 pages.
Takata, et al., "Electrical properties and practical applications of Liquid Crystal Polymer flex," *IEEE Polytronic 2007 Conference*, pp. 67-72.
Technical Article—Plastic Materials—Liquid Crystal Polymers from Steinwall Plastic Injection Molding, May 2016, 3 pages.
Theil et al., "The Effect of Thermal Cycling on a-C:F,H Low Dielectric Constant Films Deposited by ECR Plasma Enhanced Chemical Vapor Deposition," *Proceedings for the International Interconnect Technology Conference*, Jun. 1998, p. 128-131, 3 pages.
International Search Report and Written Opinion for PCT/US2020/046877 dated Nov. 9, 2020, 8 pages.
Related Application Form.
Supplementary European Search Report for EP Application No. 20867230 dated Oct. 19, 2023, 8 pages.

* cited by examiner

CIRCUIT BOARD FOR USE AT 5G FREQUENCIES

CROSS REFERENCE TO RELATED APPLICATIONS

The present application claims filing benefit of U.S. Provisional Patent Application Ser. No. 62/904,099 having a filing date of Sep. 23, 2019; U.S. Provisional Patent Application Ser. No. 62/986,098 having a filing date of Mar. 6, 2020; U.S. Provisional Patent Application Ser. No. 62/994,324 having a filing date of Mar. 25, 2020; U.S. Provisional Patent Application Ser. No. 63/009,001 having a filing date of Apr. 13, 2020; and U.S. Provisional Application Ser. No. 63/024,568 having a filing date of May 14, 2020, which are incorporated herein by reference in their entirety.

BACKGROUND OF THE INVENTION

Flexible printed circuit boards are routinely employed in high density, small electronic components. Such circuit boards are typically produced from a "copper clad laminate" that contains an insulating film and a copper foil from which the circuit paths are etched. Unfortunately, however, problems have occurred in attempting to use conventional printed circuit boards in 5G applications. More particularly, transmitting and receiving at the high frequencies encountered in a 5G application generally results in an increased amount of power consumption and heat generation. As a result, the materials often used in conventional printed circuit boards can negatively impact high frequency performance capabilities. As such, a need exists for improved printed circuit boards for use in 5G antenna systems.

SUMMARY OF THE INVENTION

In accordance with one embodiment of the present invention, a laminate for use in a circuit board is disclosed. The laminate comprises a conductive layer and a film positioned adjacent to the conductive layer. The film comprises a polymer composition that includes a liquid crystalline polymer and a hydrophobic material. The polymer composition exhibits a dielectric constant of about 5 or less and dissipation factor of about 0.05 or less at a frequency of 10 GHz.

Other features and aspects of the present invention are set forth in greater detail below.

BRIEF DESCRIPTION OF THE FIGURES

A full and enabling disclosure of the present invention, including the best mode thereof to one skilled in the art, is set forth more particularly in the remainder of the specification, including reference to the accompanying figures, in which.

DETAILED DESCRIPTION

Figure 1:
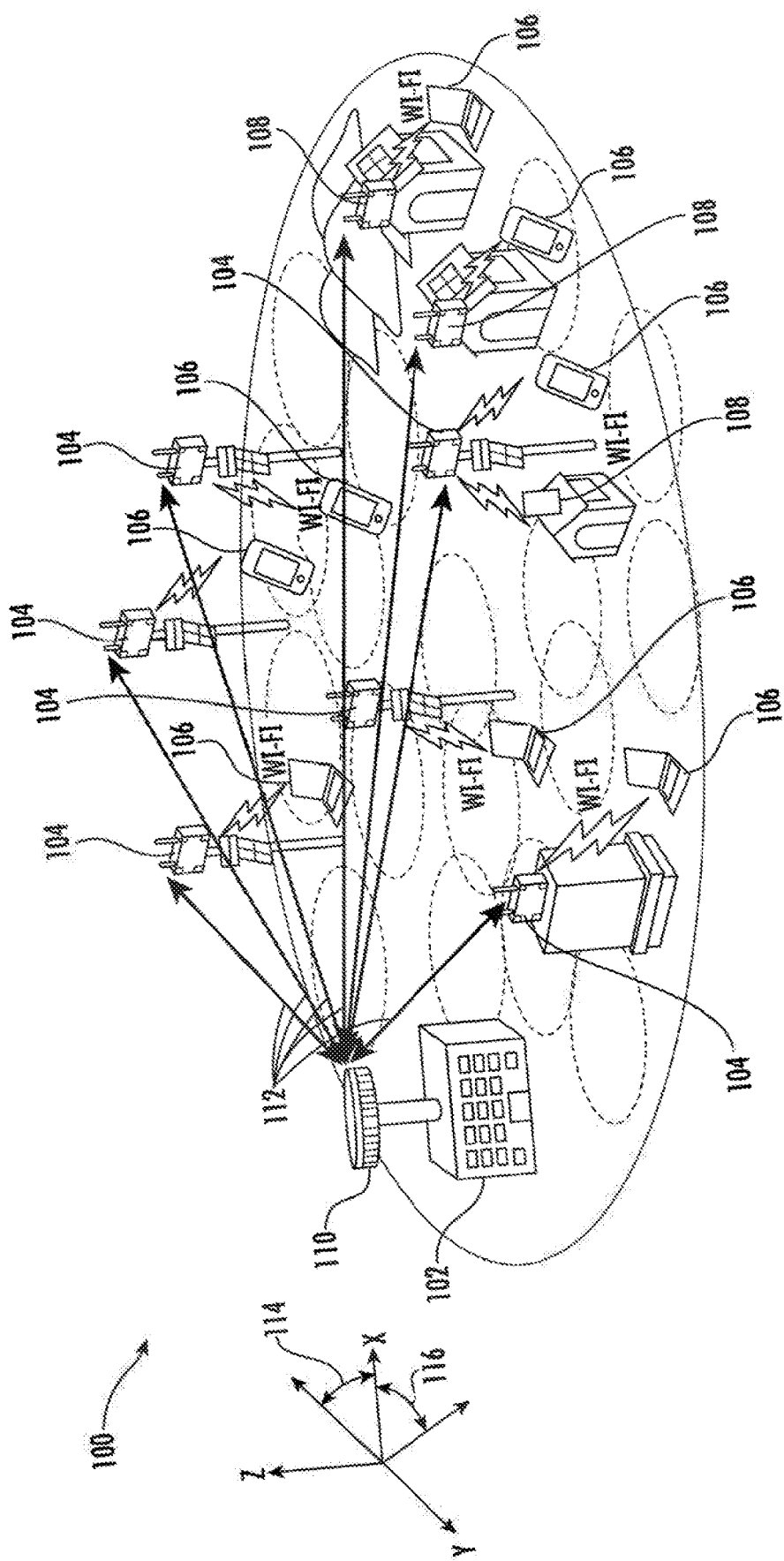
FIG. 1 depicts one embodiment of a 5G antenna system that can employed a circuit board formed according to the present invention.

It is to be understood by one of ordinary skill in the art that the present discussion is a description of exemplary embodiments only, and is not intended as limiting the broader aspects of the present invention.

Generally speaking, the present invention is directed to a laminate for use in a circuit board (e.g., printed circuit board) that contains a conductive layer and a film positioned adjacent thereto. The film is formed from a polymer composition that contains a liquid crystalline polymer and a hydrophobic material. By selectively controlling the particular nature and concentration of the components of the polymer composition, the present inventors have discovered that the resulting composition can exhibit a low dielectric constant and dissipation factor over a wide range of frequencies, making it particularly suitable for use in 5G applications. That is, the polymer composition may exhibit a low dielectric constant of about 5 or less, in some embodiments about 4.5 or less, in some embodiments from about 0.1 to about 4.4 and in some embodiments, from about 1 to about 4.2, in some embodiments, from about 1.5 to about 4, in some embodiments from about 2 to about 3.9, and in some embodiments, from about 3.5 to about 3.9 over typical 5G frequencies (e.g., 2 or 10 GHz). The dissipation factor of the polymer composition, which is a measure of the loss rate of energy, may likewise be about 0.05 or less, in some embodiments about 0.01 or less, in some embodiments from about 0.0001 to about 0.008, and in some embodiments from about 0.0002 to about 0.006 over typical 5G frequencies (e.g., 2 or 10 GHz). In fact, in some cases, the dissipation factor may be very low, such as about 0.003 or less, in some embodiments about 0.002 or less, in some embodiments about 0.001 or less, in some embodiments, about 0.0009 or less, in some embodiments about 0.0008 or less, and in some embodiments, from about 0.0001 to about 0.0007 over typical 5G frequencies (e.g., 2 or 10 GHz).

Conventionally, it was believed that polymer compositions exhibiting a low dissipation factor and dielectric constant would not also possess sufficiently good thermal, mechanical properties and ease in processing (i.e., low viscosity) to enable their use in certain types of applications. Contrary to conventional thought, however, the polymer composition has been found to possess both excellent thermal, mechanical properties and processability. For example, the melting temperature of the polymer composition may, for instance, be about 200° C. to about 400° C., in some embodiments from about 220° C. to about 380° C., in some embodiments from about 230° C. to about 330° C., and in some embodiments from about 260° C. to about 340° C. Even at such melting temperatures, the ratio of the deflection temperature under load ("DTUL"), a measure of short term heat resistance, to the melting temperature may still remain relatively high. For example, the ratio may range from about 0.5 to about 1.00, in some embodiments from about 0.6 to about 0.95, and in some embodiments from about 0.65 to about 0.85. The specific DTUL values may, for instance, be about 150° C. or more, in some embodiments from about 160° C. to about 300° C., in some embodiments from about 165° C. to about 270° C., and in some embodiments from about 175° C. to about 240° C. Such high DTUL values can, among other things, allow the use of high speed and reliable surface mounting processes for mating the structure with other components of the electrical component.

The polymer composition may also possess excellent mechanical properties. For example, the polymer composition may exhibit a tensile strength of about 10 MPa or more, in some embodiments about 50 MPa or more, in some embodiments from about 70 MPa to about 300 MPa, and in some embodiments from about 80 MPa to about 200 MPa. The polymer composition may exhibit a tensile elongation of about 0.5% or more, in some embodiments about 1% or more, in some embodiments from about 2% to about 15%, and in some embodiments from about 4% to about 12%. The polymer composition may exhibit a tensile modulus of about 5,000 MPa or more, in some embodiments about 5,000 MPa or more, in some embodiments about 6,000 MPa to about 20,000 MPa, and in some embodiments from about 6,500 MPa to about 15,000 MPa. The tensile properties may be determined at a temperature of 23° C. in accordance with ISO Test No. 527:2012. Also, the polymer composition may exhibit a flexural strength of about 20 MPa or more, in some embodiments about 30 MPa or more, in some embodiments about 50 MPa or more, in some embodiments from about 70 MPa to about 300 MPa, and in some embodiments from about 80 MPa to about 200 MPa. The polymer composition may exhibit a flexural elongation of about 0.5% or more, in some embodiments from about 1% to about 15%, and in some embodiments from about 2% to about 12%. The polymer composition may exhibit a flexural modulus of about 5,000 MPa or more, in some embodiments about 6,000 MPa or more, in some embodiments about 6,500 MPa to about 25,000 MPa, and in some embodiments from about 7,000 MPa to about 15,000 MPa. The flexural properties may be determined at a temperature of 23° C. in accordance with 178:2010. Furthermore, the polymer composition may also possess a high impact strength, which may be useful when forming thin substrates. The polymer composition may, for instance, possess a Charpy notched impact strength of about 3 kJ/m$^2$ or more, in some embodiments about 5 kJ/m$^2$ or more, in some embodiments about 7 kJ/m$^2$ or more, in some embodiments from about 8 kJ/m$^2$ to about 40 kJ/m$^2$, and in some embodiments from about 10 kJ/m$^2$ to about 25 kJ/m$^2$. The impact strength may be determined at a temperature of 23° C. in accordance with ISO Test No. ISO 179-1:2010.

Various embodiments of the present invention will now be described in more detail.

I. Polymer Composition

A. Liquid Crystalline Polymer

The polymer composition contains one or more liquid crystalline polymers, generally in an amount of from about 40 wt. % to about 99 wt. %, in some embodiments from about 50 wt. % to about 98 wt. %, and in some embodiments, from about 60 wt. % to about 95 wt. % of the entire polymer composition. Liquid crystalline polymers are generally classified as "thermotropic" to the extent that they can possess a rod-like structure and exhibit a crystalline behavior in their molten state (e.g., thermotropic nematic state). The liquid crystalline polymers employed in the polymer composition typically have a melting temperature of from about 200° C. to about 400° C., in some embodiments from about 250° C. to about 380° C., in some embodiments from about 270° C. to about 360° C., and in some embodiments from about 300° C. to about 350° C. The melting temperature may be determined as is well known in the art using differential scanning calorimetry ("DSC"), such as determined by ISO Test No. 11357-3:2011. Such polymers may be formed from one or more types of repeating units as is known in the art. A liquid crystalline polymer may, for example, contain one or more aromatic ester repeating units generally represented by the following Formula (I):

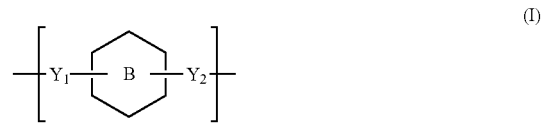

wherein,
ring B is a substituted or unsubstituted 6-membered aryl group (e.g., 1,4-phenylene or 1,3-phenylene), a substituted or unsubstituted 6-membered aryl group fused to a substituted or unsubstituted 5- or 6-membered aryl group (e.g., 2,6-naphthalene), or a substituted or unsubstituted 6-membered aryl group linked to a substituted or unsubstituted 5- or 6-membered aryl group (e.g., 4,4-biphenylene); and
$Y_1$ and $Y_2$ are independently O, C(O), NH, C(O)HN, or NHC(O).

Typically, at least one of $Y_1$ and $Y_2$ are C(O). Examples of such aromatic ester repeating units may include, for instance, aromatic dicarboxylic repeating units ($Y_1$ and $Y_2$ in Formula I are C(O)), aromatic hydroxycarboxylic repeating units ($Y_1$ is O and $Y_2$ is C(O) in Formula I), as well as various combinations thereof.

Aromatic hydroxycarboxylic repeating units, for instance, may be employed that are derived from aromatic hydroxycarboxylic acids, such as, 4-hydroxybenzoic acid; 4-hydroxy-4'-biphenylcarboxylic acid; 2-hydroxy-6-naphthoic acid; 2-hydroxy-5-naphthoic acid; 3-hydroxy-2-naphthoic acid; 2-hydroxy-3-naphthoic acid; 4'-hydroxyphenyl-4-benzoic acid; 3'-hydroxyphenyl-4-benzoic acid; 4'-hydroxyphenyl-3-benzoic acid, etc., as well as alkyl, alkoxy, aryl and halogen substituents thereof, and combination thereof. Particularly suitable aromatic hydroxycarboxylic acids are 4-hydroxybenzoic acid ("HBA") and 6-hydroxy-2-naphthoic acid ("HNA"). When employed, repeating units derived from hydroxycarboxylic acids (e.g., HBA and/or HNA) typically constitute about 20 mol. % or more, in some embodiments about 25 mol. % or more, in some embodiments about 30 mol. % or more, in some embodiments about 40 mol. % or more, in some embodiments about 50 mole % or more, in some embodiments from about 55 mol. % to 100 mol. %, and in some embodiments, from about 60 mol. % to about 95 mol. % of the polymer.

Aromatic dicarboxylic repeating units may also be employed that are derived from aromatic dicarboxylic acids, such as terephthalic acid, isophthalic acid, 2,6-naphthalenedicarboxylic acid, diphenyl ether-4,4'-dicarboxylic acid, 1,6-naphthalenedicarboxylic acid, 2,7-naphthalenedicarboxylic acid, 4,4'-dicarboxybiphenyl, bis(4-carboxyphenyl) ether, bis(4-carboxyphenyl)butane, bis(4-carboxyphenyl) ethane, bis(3-carboxyphenyl)ether, bis(3-carboxyphenyl) ethane, etc., as well as alkyl, alkoxy, aryl and halogen substituents thereof, and combinations thereof. Particularly suitable aromatic dicarboxylic acids may include, for instance, terephthalic acid ("TA"), isophthalic acid ("IA"), and 2,6-naphthalenedicarboxylic acid ("NDA"). When employed, repeating units derived from aromatic dicarboxylic acids (e.g., IA, TA, and/or NDA) each typically constitute from about 1 mol. % to about 40 mol. %, in some embodiments from about 2 mol. % to about 30 mol. %, and in some embodiments, from about 5 mol. % to about 25 mol. % of the polymer.

Other repeating units may also be employed in the polymer. In certain embodiments, for instance, repeating units may be employed that are derived from aromatic diols, such as hydroquinone, resorcinol, 2,6-dihydroxynaphthalene, 2,7-dihydroxynaphthalene, 1,6-dihydroxynaphthalene, 4,4'-dihydroxybiphenyl (or 4,4'-biphenol), 3,3'-dihydroxybiphenyl, 3,4'-dihydroxybiphenyl, 4,4'-dihydroxybiphenyl ether, bis(4-hydroxyphenyl)ethane, etc., as well as alkyl, alkoxy, aryl and halogen substituents thereof, and combinations thereof. Particularly suitable aromatic diols may include, for instance, hydroquinone ("HQ") and 4,4'-biphenol ("BP"). When employed, repeating units derived from aromatic diols (e.g., HQ and/or BP) typically constitute from about 1 mol. % to about 50 mol. %, in some embodiments from about 1 mol. % to about 40 mol. %, in some embodiments from about 2 mol. % to about 40 mol. %, in some embodiments from about 5 mol. % to about 35 mol. %, and in some embodiments, from about 5 mol. % to about 25 mol. % of the polymer.

Repeating units may also be employed, such as those derived from aromatic amides (e.g., acetaminophen ("APAP")) and/or aromatic amines (e.g., 4-aminophenol ("AP"), 3-aminophenol, 1,4-phenylenediamine, 1,3-phenylenediamine, etc.). When employed, repeating units derived from aromatic amides (e.g., APAP) and/or aromatic amines (e.g., AP) typically constitute from about 0.1 mol. % to about 20 mol. %, in some embodiments from about 0.5 mol. % to about 15 mol. %, and in some embodiments, from about 1 mol. % to about 10 mol. % of the polymer. It should also be understood that various other monomeric repeating units may be incorporated into the polymer. For instance, in certain embodiments, the polymer may contain one or more repeating units derived from non-aromatic monomers, such as aliphatic or cycloaliphatic hydroxycarboxylic acids, dicarboxylic acids, diols, amides, amines, etc. Of course, in other embodiments, the polymer may be "wholly aromatic" in that it lacks repeating units derived from non-aromatic (e.g., aliphatic or cycloaliphatic) monomers.

If desired, the liquid crystalline polymer may be a "high naphthenic" polymer to the extent that it contains a relatively high content of repeating units derived from naphthenic hydroxycarboxylic acids and naphthenic dicarboxylic acids, such as NDA, HNA, or combinations thereof. That is, the total amount of repeating units derived from naphthenic hydroxycarboxylic and/or dicarboxylic acids (e.g., NDA, HNA, or a combination of HNA and NDA) is typically about 10 mol. % or more, in some embodiments about 12 mol. % or more, in some embodiments about 15 mol. % or more, in some embodiments about 18 mol. % or more, in some embodiments about 30 mol. % or more, in some embodiments about 40 mol. % or more, in some embodiments about 45 mol. % or more, in some embodiments about 50 mol. % or more, in some embodiments about 60 mol. % or more, in some embodiments about 62 mol. % or more, in some embodiments about 68 mol. % or more, in some embodiments about 70 mol. % or more, and in some embodiments, from about 70 mol. % to about 80 mol. % of the polymer. Contrary to many conventional "low naphthenic" polymers, it is believed that the resulting "high naphthenic" polymers are capable of exhibiting good thermal and mechanical properties. Without intending to be limited by theory, it is believed that such "high naphthenic" polymers are capable of reducing the tendency of the polymer composition to absorb water, which can help stabilize the dielectric constant and dissipation factor at high frequency ranges. Namely, such high naphthenic polymers typically have a water adsorption of about 0.015% or less, in some embodiments about 0.01% or less, and in some embodiments, from about 0.0001% to about 0.008% after being immersed in water for 24 hours in accordance with ISO 62-1:2008. The high naphthenic polymers may also have a moisture adsorption of about 0.01% or less, in some embodiments about 0.008% or less, and in some embodiments, from about 0.0001% to about 0.006% after being exposed to a humid atmosphere (50% relative humidity) at a temperature of 23° C. in accordance with ISO 62-4:2008.

In one embodiment, for instance, the repeating units derived from HNA may constitute 30 mol. % or more, in some embodiments about 40 mol. % or more, in some embodiments about 45 mol. % or more, in some embodiments 50 mol. % or more, in some embodiments about 60 mol. % or more, in some embodiments about 62 mol. % or more, in some embodiments about 68 mol. % or more, in some embodiments about 70 mol. % or more, and in some embodiments, from about 70 mol. % to about 80 mol. % of the polymer. The liquid crystalline polymer may also contain various other monomers. For example, the polymer may contain repeating units derived from HBA in an amount of from about 10 mol. % to about 40 mol. %, and in some embodiments from about 15 mol. % to about 35 mol. %, and in some embodiments, from about 20 mol. % to about 30 mol. %. When employed, the molar ratio of HNA to HBA may be selectively controlled within a specific range to help achieve the desired properties, such as from about 0.1 to about 40, in some embodiments from about 0.5 to about 20, in some embodiments from about 0.8 to about 10, and in some embodiments, from about 1 to about 5. The polymer may also contain aromatic dicarboxylic acid(s) (e.g., IA and/or TA) in an amount of from about 1 mol. % to about 40 mol. %, and in some embodiments, from about 5 mol. % to about 25 mol. %; and/or aromatic diol(s) (e.g., BP and/or HQ) in an amount of from about 1 mol. % to about 40 mol. %, and in some embodiments, from about 5 mol. % to about 25 mol. %. In some cases, however, it may be desired to minimize the presence of such monomers in the polymer to help achieve the desired properties. For example, the total amount of aromatic dicarboxylic acid(s) (e.g., IA and/or TA) may be about 20 mol % or less, in some embodiments about 15 mol. % or less, in some embodiments about 10 mol. % or less, in some embodiments, from 0 mol. % to about 5 mol. %, and in some embodiments, from 0 mol. % to about 2 mol. % of the polymer. Similarly, the total amount of aromatic dicarboxylic acid(s) (e.g., IA and/or TA) may be about 20 mol % or less, in some embodiments about 15 mol. % or less, in some embodiments about 10 mol. % or less, in some embodiments, from 0 mol. % to about 5 mol. %, and in some embodiments, from 0 mol. % to about 2 mol. % of the polymer (e.g., 0 mol. %).

In another embodiment, the repeating units derived from NDA may constitute 10 mol. % or more, in some embodiments about 12 mol. % or more, in some embodiments about 15 mol. % or more, and in some embodiments, from about 18 mol. % to about 95 mol. % of the polymer. In such embodiments, the liquid crystalline polymer may also contain various other monomers, such as aromatic hydroxycarboxylic acid(s) (e.g., HBA) in an amount of from about 20 mol. % to about 60 mol. %, and in some embodiments, from about 30 mol. % to about 50 mol. %; aromatic dicarboxylic acid(s) (e.g., IA and/or TA) in an amount of from about 2 mol. % to about 30 mol. %, and in some embodiments, from about 5 mol. % to about 25 mol. %; and/or aromatic diol(s) (e.g., BP and/or HQ) in an amount of from about 2 mol. % to about 40 mol. %, and in some embodiments, from about 5 mol. % to about 35 mol. %.

Regardless of the particular constituents and nature of the polymer, the liquid crystalline polymer may be prepared by initially introducing the aromatic monomer(s) used to form the ester repeating units (e.g., aromatic hydroxycarboxylic acid, aromatic dicarboxylic acid, etc.) and/or other repeating units (e.g., aromatic diol, aromatic amide, aromatic amine, etc.) into a reactor vessel to initiate a polycondensation reaction. The particular conditions and steps employed in such reactions are well known, and may be described in more detail in U.S. Pat. No. 4,161,470 to Calundann; U.S. Pat. No. 5,616,680 to Linstid, III, et al.; U.S. Pat. No. 6,114,492 to Linstid, III, et al.; U.S. Pat. No. 6,514,611 to Shepherd, et al.; and WO 2004/058851 to Waggoner. The vessel employed for the reaction is not especially limited, although it is typically desired to employ one that is commonly used in reactions of high viscosity fluids. Examples of such a reaction vessel may include a stirring tank-type apparatus that has an agitator with a variably-shaped stirring blade, such as an anchor type, multistage type, spiral-ribbon type, screw shaft type, etc., or a modified shape thereof. Further examples of such a reaction vessel may include a mixing apparatus commonly used in resin kneading, such as a kneader, a roll mill, a Banbury mixer, etc.

If desired, the reaction may proceed through the acetylation of the monomers as known the art. This may be accomplished by adding an acetylating agent (e.g., acetic anhydride) to the monomers. Acetylation is generally initiated at temperatures of about 90° C. During the initial stage of the acetylation, reflux may be employed to maintain vapor phase temperature below the point at which acetic acid byproduct and anhydride begin to distill. Temperatures during acetylation typically range from between 90° C. to 150° C., and in some embodiments, from about 110° C. to about 150° C. If reflux is used, the vapor phase temperature typically exceeds the boiling point of acetic acid, but remains low enough to retain residual acetic anhydride. For example, acetic anhydride vaporizes at temperatures of about 140° C. Thus, providing the reactor with a vapor phase reflux at a temperature of from about 110° C. to about 130° C. is particularly desirable. To ensure substantially complete reaction, an excess amount of acetic anhydride may be employed. The amount of excess anhydride will vary depending upon the particular acetylation conditions employed, including the presence or absence of reflux. The use of an excess of from about 1 to about 10 mole percent of acetic anhydride, based on the total moles of reactant hydroxyl groups present is not uncommon.

Acetylation may occur in in a separate reactor vessel, or it may occur in situ within the polymerization reactor vessel. When separate reactor vessels are employed, one or more of the monomers may be introduced to the acetylation reactor and subsequently transferred to the polymerization reactor. Likewise, one or more of the monomers may also be directly introduced to the reactor vessel without undergoing pre-acetylation.

In addition to the monomers and optional acetylating agents, other components may also be included within the reaction mixture to help facilitate polymerization. For instance, a catalyst may be optionally employed, such as metal salt catalysts (e.g., magnesium acetate, tin(I) acetate, tetrabutyl titanate, lead acetate, sodium acetate, potassium acetate, etc.) and organic compound catalysts (e.g., N-methylimidazole). Such catalysts are typically used in amounts of from about 50 to about 500 parts per million based on the total weight of the recurring unit precursors. When separate reactors are employed, it is typically desired to apply the catalyst to the acetylation reactor rather than the polymerization reactor, although this is by no means a requirement.

The reaction mixture is generally heated to an elevated temperature within the polymerization reactor vessel to initiate melt polycondensation of the reactants. Polycondensation may occur, for instance, within a temperature range of from about 250° C. to about 380° C., and in some embodiments, from about 280° C. to about 380° C. For instance, one suitable technique for forming the aromatic polyester may include charging precursor monomers and acetic anhydride into the reactor, heating the mixture to a temperature of from about 90° C. to about 150° C. to acetylize a hydroxyl group of the monomers (e.g., forming acetoxy), and then increasing the temperature to from about 280° C. to about 380° C. to carry out melt polycondensation. As the final polymerization temperatures are approached, volatile byproducts of the reaction (e.g., acetic acid) may also be removed so that the desired molecular weight may be readily achieved. The reaction mixture is generally subjected to agitation during polymerization to ensure good heat and mass transfer, and in turn, good material homogeneity. The rotational velocity of the agitator may vary during the course of the reaction, but typically ranges from about 10 to about 100 revolutions per minute ("rpm"), and in some embodiments, from about 20 to about 80 rpm. To build molecular weight in the melt, the polymerization reaction may also be conducted under vacuum, the application of which facilitates the removal of volatiles formed during the final stages of polycondensation. The vacuum may be created by the application of a suctional pressure, such as within the range of from about 5 to about 30 pounds per square inch ("psi"), and in some embodiments, from about 10 to about 20 psi.

Following melt polymerization, the molten polymer may be discharged from the reactor, typically through an extrusion orifice fitted with a die of desired configuration, cooled, and collected. Commonly, the melt is discharged through a perforated die to form strands that are taken up in a water bath, pelletized and dried. In some embodiments, the melt polymerized polymer may also be subjected to a subsequent solid-state polymerization method to further increase its molecular weight. Solid-state polymerization may be conducted in the presence of a gas (e.g., air, inert gas, etc.). Suitable inert gases may include, for instance, nitrogen, helium, argon, neon, krypton, xenon, etc., as well as combinations thereof. The solid-state polymerization reactor vessel can be of virtually any design that will allow the polymer to be maintained at the desired solid-state polymerization temperature for the desired residence time. Examples of such vessels can be those that have a fixed bed, static bed, moving bed, fluidized bed, etc. The temperature at which solid-state polymerization is performed may vary, but typically within a range of from about 250° C. to about 350° C. The polymerization time will of course vary based on the temperature and target molecular weight. In most cases, however, the solid-state polymerization time will be from about 2 to about 12 hours, and in some embodiments, from about 4 to about 10 hours.

Generally speaking, the total amount of liquid crystalline polymers employed in the polymer composition is from about 40 wt. % to about 99.5 wt. %, in some embodiments from about 50 wt. % to about 99 wt. %, in some embodiments, from about 60 wt. % to about 98 wt. %, and in some embodiments, from about 70 wt. % to about 95 wt. % of the polymer composition. In certain embodiments, all of the liquid crystalline polymers are "high naphthenic" polymers such as described above. In other embodiments, however, "low naphthenic" liquid crystalline polymers may also be employed in the composition in which the total amount of repeating units derived from naphthenic hydroxycarboxylic and/or dicarboxylic acids (e.g., NDA, HNA, or a combination of HNA and NDA) is less than 10 mol. %, in some embodiments about 8 mol. % or less, in some embodiments about 6 mol. % or less, and in some embodiments, from about 1 mol. % to about 5 mol. % of the polymer. In certain embodiments, it may be desired that the low naphthenic polymers are present in only a relatively low amount. For example, when employed, low naphthenic liquid crystalline polymers typically constitute from about 1 wt. % to about 50 wt. %, in some embodiments from about 2 wt. % to about 40 wt. %, and in some embodiments, from about 5 wt. % to about 30 wt. % of the total amount of liquid crystalline polymers in the composition, and from about 0.5 wt. % to about 45 wt. %, in some embodiments from about 2 wt. % to about 35 wt. %, and in some embodiments from about 5 wt. % to about 25 wt. % of the entire composition. Conversely, high naphthenic liquid crystalline polymers typically constitute from about 50 wt. % to about 99 wt. %, in some embodiments from about 60 wt. % to about 98 wt. %, and in some embodiments, from about 70 wt. % to about 95 wt. % of the total amount of liquid crystalline polymers in the composition, and from about 55 wt. % to about 99.5 wt. %, in some embodiments from about 65 wt. % to about 98 wt. %, and in some embodiments, from about 75 wt. % to about 95 wt. % of the entire composition.

B. Hydrophobic Material

As noted above, a hydrophobic material is also employed in the polymer composition that is distributed throughout the polymer matrix. Without intending to be limited by theory, it is believed that the hydrophobic material can help reduce the tendency of the polymer composition to absorb water, which can help stabilize the dielectric constant and dissipation factor at high frequency ranges. The weight ratio of liquid crystalline polymer(s) to hydrophobic material(s) is typically from about 1 to about 20, in some embodiments from about 2 to about 15, and in some embodiments, from about 3 to about 10. For example, the hydrophobic material may constitute from about 1 wt. % to about 60 wt. %, in some embodiments from about 2 wt. % to about 50 wt. %, and in some embodiments, from about 5 wt. % to about 40 wt. % of the entire polymer composition.

Particularly suitable hydrophobic materials are low surface energy elastomers, such as fluoropolymers, silicone polymers, etc. Fluoropolymers, for instance, may contains a hydrocarbon backbone polymer in which some or all of the hydrogen atoms are substituted with fluorine atoms. The backbone polymer may be polyolefinic and formed from fluorine-substituted, unsaturated olefin monomers. The fluoropolymer can be a homopolymer of such fluorine-substituted monomers or a copolymer of fluorine-substituted monomers or mixtures of fluorine-substituted monomers and non-fluorine-substituted monomers. Along with fluorine atoms, the fluoropolymer can also be substituted with other halogen atoms, such as chlorine and bromine atoms. Representative monomers suitable for forming fluoropolymers for use in this invention are tetrafluoroethylene ("TFE"), vinylidene fluoride ("VF2"), hexafluoropropylene ("HFP"), chlorotrifluoroethylene ("CTFE"), perfluoroethylvinyl ether ("PEVE"), perfluoromethylvinyl ether ("PMVE"), perfluoropropylvinyl ether ("PPVE"), etc., as well as mixtures thereof. Specific examples of suitable fluoropolymers include polytetrafluoroethylene ("PTFE"), perfluoroalkylvinyl ether ("PVE"), poly(tetrafluoroethylene-co-perfluoroalkyvinyl ether) ("PFA"), fluorinated ethylene-propylene copolymer ("FEP"), ethylene-tetrafluoroethylene copolymer ("ETFE"), polyvinylidene fluoride ("PVDF"), polychlorotrifluoroethylene ("PCTFE"), and TFE copolymers with VF2 and/or HFP, etc., as well as mixtures thereof.

In certain embodiments, the hydrophobic material (e.g., fluoropolymer) may have a particle size that is selectively controlled to help form films of a relatively low thickness. For example, the hydrophobic material may have a median particle size (e.g., diameter) of about 1 to about 60 micrometers, in some embodiments from about 2 to about 55 micrometers, in some embodiments from about 3 to about 50 micrometers, and in some embodiments, from about 25 to about 50 micrometers, such as determined using laser diffraction techniques in accordance with ISO 13320:2009 (e.g., with a Horiba LA-960 particle size distribution analyzer). The hydrophobic material may also have a narrow size distribution. That is, at least about 70% by volume of the particles, in some embodiments at least about 80% by volume of the particles, and in some embodiments, at least about 90% by volume of the particles may have a size within the ranges noted above.

C. Other Additives

A wide variety of additional additives can also be included in the polymer composition, such as lubricants, fibrous fillers, particulate fillers, hollow fillers, laser activatable additives, thermally conductive fillers, pigments, antioxidants, stabilizers, surfactants, waxes, flame retardants, anti-drip additives, nucleating agents (e.g., boron nitride), flow modifiers, coupling agents, antimicrobials, pigments or other colorants, impact modifiers, and other materials added to enhance properties and processability.

i. Fibrous Filler

In one embodiment, for example, a fibrous filler may be employed in the polymer composition, such as in an amount from about 1 wt. % to about 40 wt. %, in some embodiments from about 3 wt. % to about 30 wt. %, and in some embodiments, from about 5 wt. % to about 20 wt. % of the polymer composition. The fibrous filler typically includes fibers having a high degree of tensile strength relative to their mass. For example, the ultimate tensile strength of the fibers (determined in accordance with ASTM D2101) is typically from about 1,000 to about 15,000 Megapascals ("MPa"), in some embodiments from about 2,000 MPa to about 10,000 MPa, and in some embodiments from about 3,000 MPa to about 6,000 MPa. To help maintain the desired dielectric properties, such high strength fibers may be formed from materials that are generally insulative in nature, such as glass, ceramics or minerals (e.g., alumina or silica), aramids (e.g., Kevler® marketed by E. I. duPont de Nemours, Wilmington, Del.), minerals, polyolefins, polyesters, etc. The fibrous filler may include glass fibers, mineral fibers, or a mixture thereof. For instance, in one embodiment, the fibrous filler may include glass fibers. The glass fibers particularly suitable may include E-glass, A-glass, C-glass, D-glass, AR-glass, R-glass, S1-glass, S2-glass, etc. In another embodiment, the fibrous filler may include mineral fibers. The mineral fibers may include those derived from silicates, such as neosilicates, sorosilicates, inosilicates (e.g., calcium inosilicates, such as wollastonite; calcium magnesium inosilicates, such as tremolite; calcium magnesium iron inosilicates, such as actinolite; magnesium iron inosilicates, such as anthophyllite; etc.), phyllosilicates (e.g., aluminum phyllosilicates, such as palygorskite), tectosilicates, etc.; sulfates, such as calcium sulfates (e.g., dehydrated or anhydrous gypsum); mineral wools (e.g., rock or slag wool); and so forth. Particularly suitable are inosilicates, such as wollastonite fibers available from Nyco Minerals under the trade designation NYGLOS® (e.g., NYGLOS® 4 W or NYGLOS® 8).

Further, although the fibrous fillers may have a variety of different sizes, fibers having a certain aspect ratio can help improve the mechanical properties of the polymer composition. That is, fibrous fillers having an aspect ratio (average length divided by nominal diameter) of about 2 or more, in some embodiments about 4 or more, in some embodiments from about 5 to about 50, and in some embodiments from about 8 to about 40 may be particularly beneficial. Such fibrous fillers may, for instance, have a weight average length of about 10 micrometer or more, in some embodiments about 25 micrometers or more, in some embodiments from about 50 micrometers or more to about 800 micrometers or less, and in some embodiments from about 60 micrometers to about 500 micrometers. Also, such fibrous fillers may, for instance, have a volume average length of about 10 micrometer or more, in some embodiments about 25 micrometers or more, in some embodiments from about 50 micrometers or more to about 800 micrometers or less, and in some embodiments from about 60 micrometers to about 500 micrometers. The fibrous fillers may likewise have a nominal diameter of about 5 micrometers or more, in some embodiments about 6 micrometers or more, in some embodiments from about 8 micrometers to about 40 micrometers, and in some embodiments from about 9 micrometers to about 20 micrometers. The relative amount of the fibrous filler may also be selectively controlled to help achieve the desired mechanical and thermal properties without adversely impacting other properties of the polymer composition, such as its flowability and dielectric properties, etc. In this regard, the fibrous fillers may have a dielectric constant of about 6 or less, in some embodiments about 5.5 or less, in some embodiments from about 1.1 to about 5, and in some embodiments from about 2 to about 4.8 at a frequency of 1 GHz.

The fibrous filler may be in a modified or an unmodified form, e.g., provided with a sizing, or chemically treated, in order to improve adhesion to the plastic. In some examples, glass fibers may be provided with a sizing to protect the glass fiber, to smooth the fiber but also to improve the adhesion between the fiber and a matrix material. If present, a sizing may comprise silanes, film forming agents, lubricants, wetting agents, adhesive agents optionally antistatic agents and plasticizers, emulsifiers and optionally further additives. In one particular embodiment, the sizing may include a silane. Specific examples of silanes are aminosilanes, e.g. 3-trimethoxysilylpropylamine, N-(2-aminoethyl)-3-aminopropyltrimethoxy-silane, N-(3-trimethoxysilanylpropyl)ethane-1,2-diamine, 3-(2-aminoethyl-amino) propyltrimethoxysilane, N-[3-(trimethoxysilyl)propyl]-1,2-ethane-diamine.

ii. Laser Activatable Additive

In certain other embodiments, the polymer composition may be "laser activatable" in the sense that it contains an additive that can be activated by a laser direct structuring ("LDS") process. In such a process, the additive is exposed to a laser that causes the release of metals. The laser thus draws the pattern of conductive elements onto the part and leaves behind a roughened surface containing embedded metal particles. These particles act as nuclei for the crystal growth during a subsequent plating process (e.g., copper plating, gold plating, nickel plating, silver plating, zinc plating, tin plating, etc.). The laser activatable additive generally includes spinel crystals, which may include two or more metal oxide cluster configurations within a definable crystal formation. For example, the overall crystal formation may have the following general formula:

wherein,

A is a metal cation having a valance of 2, such as cadmium, chromium, manganese, nickel, zinc, copper, cobalt, iron, magnesium, tin, titanium, etc., as well as combinations thereof; and B is a metal cation having a valance of 3, such as chromium, iron, aluminum, nickel, manganese, tin, etc., as well as combinations thereof.

Typically, A in the formula above provides the primary cation component of a first metal oxide cluster and B provides the primary cation component of a second metal oxide cluster. These oxide clusters may have the same or different structures. In one embodiment, for example, the first metal oxide cluster has a tetrahedral structure and the second metal oxide cluster has an octahedral cluster. Regardless, the clusters may together provide a singular identifiable crystal type structure having heightened susceptibility to electromagnetic radiation. Examples of suitable spinel crystals include, for instance, $MgAl_2O_4$, $ZnAl_2O_4$, $FeAl_2O_4$, $CuFe_2O_4$, $CuCr_2O_4$, $MnFe_2O_4$, $NiFe_2O_4$, $TiFe_2O_4$, $FeCr_2O_4$, $MgCr_2O_4$, etc. Copper chromium oxide ($CuCr_2O_4$) is particularly suitable for use in the present invention and is available from Shepherd Color Co. under the designation "Shepherd Black 1GM."

Laser activatable additives may constitute from about 0.1 wt. % to about 30 wt. %, in some embodiments from about 0.5 wt. % to about 20 wt. %, and in some embodiments, from about 1 wt. % to about 10 wt. % of the polymer composition.

iii. Hollow Filler

Although by no means required, the polymer composition may also include one or more hollow inorganic fillers to help achieve the desired dielectric constant. For instance, such fillers may have a dielectric constant of about 3.0 or less, in some embodiments about 2.5 or less, in some embodiments from about 1.1 to about 2.3, and in some embodiments from about 1.2 to about 2.0 at 100 MHz. The hollow inorganic fillers typically have an interior hollow space or cavity and may be synthesized using techniques known in the art. The hollow inorganic fillers may be made from conventional materials. For instance, the hollow inorganic fillers may include alumina, silica, zirconia, magnesia, glass, fly ash, borate, phosphate, ceramic, and the like. In one embodiment, the hollow inorganic fillers may include hollow glass fillers, hollow ceramic fillers, and mixtures thereof. In one embodiment, the hollow inorganic fillers include hollow glass fillers. The hollow glass fillers may be made from a soda lime borosilicate glass, a soda lime glass, a borosilicate glass, a sodium borosilicate glass, a sodium silicate glass, or an aluminosilicate glass. In this regard, in one embodiment, the composition of the glass, while not limited, may be at least about 65% by weight of $SiO_2$, 3-15% by weight of $Na_2O$, 8-15% by weight of CaO, 0.1-5% by weight of MgO, 0.01-3% by weight of $Al_2O_3$, 0.01-1% by weight of $K_2O$, and optionally other oxides (e.g., $Li_2O$, $Fe_2O_3$, $TiO_2$, $B_2O_3$). In another embodiment, the composition may be about 50-58% by weight of $SiO_2$, 25-30% by weight of $Al_2O_3$, 6-10% by weight of CaO, 1-4% by weight of $Na_2O/K_2O$, and 1-5% by weight of other oxides. Also, in one embodiment, the hollow glass fillers may include more alkaline earth metal oxides than alkali metal oxides. For example, the weight ratio of the alkaline earth metal oxides to the alkali metal oxides may be more than 1, in some embodiments about 1.1 or more, in some embodiments about 1.2 to about 4, and in some embodiments from about 1.5 to about 3. Regardless of the above, it should be understood that the glass composition may vary depending on the type of glass utilized and still provide the benefits as desired by the present invention.

The hollow inorganic fillers may have at least one dimension having an average value that is about 1 micrometers or more, in some embodiments about 5 micrometers or more, in some embodiments about 8 micrometers or more, in some embodiments from about 1 micrometer to about 150 micrometers, in some embodiments from about 10 micrometers to about 150 micrometers, and in some embodiments from about 12 micrometers to about 50 micrometers. In one embodiment, such average value may refer to a $d_{50}$ value. Furthermore, the hollow inorganic fillers may have a $D_{10}$ of about 3 micrometers or more, in some embodiments about 4 micrometers or more, in some embodiments from about 5 micrometers to about 20 micrometers, and in some embodiments from about 6 micrometers to about 15 micrometers. The hollow inorganic fillers may have a $D_{90}$ of about 10 micrometers or more, in some embodiments about 15 micrometers or more, in some embodiments from about 20 micrometers to about 150 micrometers, and in some embodiments from about 22 micrometers to about 50 micrometers. In this regard, the hollow inorganic fillers may be present in a size distribution, which may be a Gaussian, normal, or non-normal size distribution. In one embodiment, the hollow inorganic fillers may have a Gaussian size distribution. In another embodiment, the hollow inorganic fillers may have a normal size distribution. In a further embodiment, the hollow inorganic fillers may have a non-normal size distribution. Examples of non-normal size distributions may include unimodal and multi-modal (e.g., bimodal) size distributions. When referring to dimensions above, such dimension may be any dimension. In one embodiment, however, such dimension refers to a diameter. For example, such value for the dimension refers to an average diameter of spheres. The dimension, such as the average diameter, may be determined in accordance to 3M QCM 193.0. In this regard, in one embodiment, the hollow inorganic fillers may be referring to hollow spheres such as hollow glass spheres. For instance, the hollow inorganic fillers may have an average aspect ratio of approximately 1. In general, the average aspect ratio may be about 0.8 or more, in some embodiments about 0.85 or more, in some embodiments from about 0.9 to about 1.3, and in some embodiments from about 0.95 to about 1.05.

In addition, the hollow inorganic fillers may have relatively thin walls to help with the dielectric properties of the polymer composition as well as the reduction in weight. The thickness of the wall may be about 50% or less, in some embodiments about 40% or less, in some embodiments from about 1% to about 30%, and in some embodiments from about 2% to about 25% the average dimension, such as the average diameter, of the hollow inorganic fillers. In addition, the hollow inorganic fillers may have a certain true density that can allow for easy handling and provide a polymer composition having a reduction in weight. In general, the true density refers to the quotient obtained by dividing the mass of a sample of the hollow fillers by the true volume of that mass of hollow fillers wherein the true volume is referred to as the aggregate total volume of the hollow fillers. In this regard, the true density of the hollow inorganic fillers may be about 0.1 $g/cm^3$ or more, in some embodiments about 0.2 $g/cm^3$ or more, in some embodiments from about 0.3 $g/cm^3$ or more to about 1.2 $g/cm^3$, and in some embodiments from about 0.4 $g/cm^3$ or more to about 0.9 $g/cm^3$. The true density may be determined in accordance to 3M QCM 14.24.1.

Even though the fillers are hollow, they may have a mechanical strength that allows for maintaining the integrity of the structure of the fillers resulting in a lower likelihood of the fillers being broken during processing and/or use. In this regard, the isotactic crush resistance (i.e., wherein at least 80 vol. %, such as at least 90 vol. % of the hollow fillers survive) of the hollow inorganic fillers may be about 20 MPa or more, in some embodiments about 100 MPa or more, in some embodiments from about 150 MPa to about 500 MPa, and in some embodiments from about 200 MPa to about 350 MPa. The isotactic crush resistance may be determined in accordance to 3M QCM 14.1.8.

The alkalinity of the hollow inorganic fillers may be about 1.0 meq/g or less, in some embodiments about 0.9 meq/g or less, in some embodiments from about 0.1 meq/g to about 0.8 meq/g, and in some embodiments from about 0.2 meq/g to about 0.7 meq/g. The alkalinity may be determined in accordance to 3M QCM 55.19. In order to provide a relatively low alkalinity, the hollow inorganic fillers may be treated with a suitable acid, such as a phosphoric acid. In addition, the hollow inorganic fillers may also include a surface treatment to assist with providing a better compatibility with the polymer and/or other components within the polymer composition. As an example, the surface treatment may be a silanization. In particular, the surface treatment agents may include, but are not limited to, aminosilanes, epoxysilanes, etc.

When employed, the hollow inorganic fillers may, for instance, constitute about 1 wt. % or more, in some embodiments about 4 wt. % or more, in some embodiments from about 5 wt. % to about 40 wt. %, and in some embodiments from about 10 wt. % to about 30 wt. % of the polymer composition.

iv. Particulate Filler

If desired, a particulate filler may be employed for improving certain properties of the polymer composition. The particulate filler may be employed in the polymer composition in an amount of from about 5 to about 60 parts, in some embodiments from about 10 to about 50 parts, and in some embodiments, from about 15 to about 40 parts by weight per 100 parts of the liquid crystalline polymer(s) employed in the polymer composition. For instance, the particulate filler may constitute from about 5 wt. % to about 50 wt. %, in some embodiments from about 10 wt. % to about 40 wt. %, and in some embodiments, from about 15 wt. % to about 30 wt. % of the polymer composition.

In certain embodiments, particles may be employed that have a certain hardness value to help improve the surface properties of the composition. For instance, the hardness values may be about 2 or more, in some embodiments about 2.5 or more, in some embodiments from about 3 to about 11, in some embodiments from about 3.5 to about 11, and in some embodiments, from about 4.5 to about 6.5 based on the Mohs hardness scale. Examples of such particles may include, for instance, silica (Mohs hardness of 7), mica (e.g., Mohs hardness of about 3); carbonates, such as calcium carbonate ($CaCO_3$, Mohs hardness of 3.0) or a copper carbonate hydroxide ($Cu_2CO_3(OH)_2$, Mohs hardness of 4.0); fluorides, such as calcium fluoride ($CaFl_2$, Mohs hardness of 4.0); phosphates, such as calcium pyrophosphate (($Ca_2P_2O_7$, Mohs hardness of 5.0), anhydrous dicalcium phosphate ($CaHPO_4$, Mohs hardness of 3.5), or hydrated aluminum phosphate ($AlPO_4 \cdot 2H_2O$, Mohs hardness of 4.5); borates, such as calcium borosilicate hydroxide ($Ca_2B_5SiO_9(OH)_5$, Mohs hardness of 3.5); alumina ($AlO_2$, Mohs hardness of 10.0); sulfates, such as calcium sulfate ($CaSO_4$, Mohs hardness of 3.5) or barium sulfate ($BaSO_4$, Mohs hardness of from 3 to 3.5); and so forth, as well as combinations thereof.

The shape of the particles may vary as desired. For instance, flake-shaped particles may be employed in certain embodiments that have a relatively high aspect ratio (e.g., average diameter divided by average thickness), such as about 10:1 or more, in some embodiments about 20:1 or more, and in some embodiments, from about 40:1 to about 200:1. The average diameter of the particles may, for example, range from about 5 micrometers to about 200 micrometers, in some embodiments from about 30 micrometers to about 150 micrometers, and in some embodiments, from about 50 micrometers to about 120 micrometers, such as determined using laser diffraction techniques in accordance with ISO 13320:2009 (e.g., with a Horiba LA-960 particle size distribution analyzer). Suitable flaked-shaped particles may be formed from a natural and/or synthetic silicate mineral, such as mica, halloysite, kaolinite, illite, montmorillonite, vermiculite, palygorskite, pyrophyllite, calcium silicate, aluminum silicate, wollastonite, etc. Mica, for instance, is particularly suitable. Any form of mica may generally be employed, including, for instance, muscovite ($KAl_2(AlSi_3)O_{10}(OH)_2$), biotite ($K(Mg,Fe)_3(AlSi_3)O_{10}(OH)_2$), phlogopite ($KMg_3(AlSi_3)O_{10}(OH)_2$), lepidolite ($K(Li,Al)_{2-3}(AlSi_3)O_{10}(OH)_2$), glauconite ($(K,Na)(Al,Mg,Fe)_2(Si,Al)_4O_{10}(OH)_2$), etc. Granular particles may also be employed. Typically, such particles have an average diameter of from about 0.1 to about 10 micrometers, in some embodiments from about 0.2 to about 4 micrometers, and in some embodiments, from about 0.5 to about 2 micrometers, such as determined using laser diffraction techniques in accordance with ISO 13320:2009 (e.g., with a Horiba LA-960 particle size distribution analyzer). Particularly suitable granular fillers may include, for instance, talc, barium sulfate, calcium sulfate, calcium carbonate, etc.

The particulate filler may be formed primarily or entirely from one type of particle, such as flake-shaped particles (e.g., mica) or granular particles (e.g., barium sulfate). That is, such flaked-shaped or granular particles may constitute about 50 wt. % or more, and in some embodiments, about 75 wt. % or more (e.g., 100 wt. %) of the particulate filler. Of course, in other embodiments, flake-shaped and granular particles may also be employed in combination. In such embodiments, for example, flake-shaped particles may constitute from about 0.5 wt. % to about 20 wt. %, and in some embodiments, from about 1 wt. % to about 10 wt. % of the particulate filler, while the granular particles constitute from about 80 wt. % to about 99.5 wt. %, and in some embodiments, from about 90 wt. % to about 99 wt. % of the particulate filler.

If desired, the particles may also be coated with a fluorinated additive to help improve the processing of the composition, such as by providing better mold filling, internal lubrication, mold release, etc. The fluorinated additive may include a fluoropolymer, which contains a hydrocarbon backbone polymer in which some or all of the hydrogen atoms are substituted with fluorine atoms. The backbone polymer may be polyolefinic and formed from fluorine-substituted, unsaturated olefin monomers. The fluoropolymer can be a homopolymer of such fluorine-substituted monomers or a copolymer of fluorine-substituted monomers or mixtures of fluorine-substituted monomers and non-fluorine-substituted monomers. Along with fluorine atoms, the fluoropolymer can also be substituted with other halogen atoms, such as chlorine and bromine atoms. Representative monomers suitable for forming fluoropolymers for use in this invention are tetrafluoroethylene, vinylidene fluoride, hexafluoropropylene, chlorotrifluoroethylene, perfluoroethylvinyl ether, perfluoromethylvinyl ether, perfluoropropylvinyl ether, etc., as well as mixtures thereof. Specific examples of suitable fluoropolymers include polytetrafluoroethylene, perfluoroalkylvinyl ether, poly(tetrafluoroethylene-co-perfluoroalkyvinylether), fluorinated ethylene-propylene copolymer, ethylene-tetrafluoroethylene copolymer, polyvinylidene fluoride, polychlorotrifluoroethylene, etc., as well as mixtures thereof.

II. Formation

The components used to form the polymer composition may be combined together using any of a variety of different techniques as is known in the art. In one particular embodiment, for example, the liquid crystalline polymer, hydrophobic material, and other optional additives are melt processed as a mixture within an extruder to form the polymer composition. The mixture may be melt-kneaded in a single-screw or multi-screw extruder at a temperature of from about 200° C. to about 450° C. In one embodiment, the mixture may be melt processed in an extruder that includes multiple temperature zones. The temperature of individual zones are typically set within about −60° C. to about 25° C. relative to the melting temperature of the polymer. By way of example, the mixture may be melt processed using a twin screw extruder such as a Leistritz 18-mm co-rotating fully intermeshing twin screw extruder. A general purpose screw design can be used to melt process the mixture. In one embodiment, the mixture including all of the components may be fed to the feed throat in the first barrel by means of a volumetric feeder. In another embodiment, different components may be added at different addition points in the extruder, as is known. For example, the polymer may be applied at the feed throat, and certain additives (e.g., hydrophobic material) may be supplied at the same or different temperature zone located downstream therefrom. Regardless, the resulting mixture can be melted and mixed then extruded through a die. The extruded polymer composition can then be quenched in a water bath to solidify and granulated in a pelletizer followed by drying.

In addition to being mixed during melt processing, it is also possible to incorporate the hydrophobic material into the polymer matrix during formation of the liquid crystalline polymer. For example, the aromatic precursor monomers used to form the liquid crystalline polymer may be reacted in the presence of the hydrophobic material (e.g., within the polymerization apparatus). In this manner, the hydrophobic material can become physically incorporated into the resulting polymer matrix. Although it may be introduced at any time, it is typically desired to apply the hydrophobic material before melt polymerization has been initiated, and typically in conjunction with the other aromatic precursor monomers for the polymer. The relative amount of the hydrophobic material added to the reaction vary, but is typically from about 0.1 wt. % to about 35 wt. %, in some embodiments from about 0.5 wt. % to about 30 wt. %, and in some embodiments, from about 1 wt. % to about 25 wt. % of the reaction mixture.

Regardless of the manner in which the components are incorporated into the composition, the resulting melt viscosity is generally low enough that it can readily flow into the cavity of a mold to form a small-sized circuit substrate. For example, in one particular embodiment, the polymer composition may have a melt viscosity of from about 5 Pa-s or more, in some embodiments about 10 Pa-s or more, in some embodiments from about 10 Pa-s to about 500 Pa-s, in some embodiments from about 5 Pa-s to about 150 Pa-s, in some embodiments from about 5 Pa-s to about 100 Pa-s, in some embodiments from about 10 Pa-s to about 100 Pa-s, in some embodiments from about 15 to about 90 Pa-s, as determined at a shear rate of 1,000 seconds$^{-1}$.

III. Film

As noted above, the liquid crystalline polymer composition of the present invention is particularly well suited for use in films. Any of variety of different techniques may generally be used to form the polymer composition into a film. Suitable film-forming techniques may include, for instance, flat sheet die extrusion, blown film extrusion, tubular trapped bubble film processes, etc. In one particular embodiment, a flat sheet die extrusion process is employed that utilizes a T-shaped die. The die typically contains arms that extend at right angles from an initial extrusion channel. The arms may have a slit along their length to allow the polymer melt to flow therethrough. Examples of such film extrusion processes are described, for instance, in U.S. Pat. No. 4,708,629 to Kasamatsu. In another embodiment, a blown film process may be employed in which the composition is fed to an extruder, where it is melt processed and then supplied through a blown film die to form a molten bubble. Typically, the die contains a mandrel that is positioned within the interior of an outer die body so that a space is defined therebetween. The polymer composition is blown through this space to form the bubble, which can then be drawn, inflated with air, and rapidly cooled so that the polymer composition quickly solidifies. If desired, the bubble may then be collapsed between rollers and optionally wound onto a reel.

In one particular embodiment, a film may be formed from the polymer composition that has a thickness of from about 0.5 to about 500 micrometers, in some embodiments from about 1 to about 250 micrometers, in some embodiments from about 2 to about 150 micrometers, in some embodiments from about 3 to about 100 micrometers, and in some embodiments, from about 5 to about 60 micrometers. Likewise, thick films (or sheets) may have a thickness of from about 500 micrometers to about 25 millimeters, in some embodiments from about 600 micrometers to about 20 millimeters, and in some embodiments, from about 1 millimeter to about 10 millimeters.

Due to the unique properties of the liquid crystalline polymer composition, a film may be formed therefrom that exhibits good mechanical properties. One parameter that is indicative of the relative strength of the film is the tensile strength, which is equal to the peak stress obtained in a stress-strain curve. Desirably, the film exhibits a tensile strength in the machine direction ("MD") of from about 100 to about 800 Megapascals (MPa), in some embodiments from about 150 to about 600 MPa, and in some embodiments, from about 200 to about 400 MPa, and a tensile strength in the transverse direction ("TD") of from about 1 to about 50 Megapascals (MPa), in some embodiments from about 5 to about 40 MPa, and in some embodiments, from about 10 to about 30 MPa. The film may also be ductile and thus exhibit a high elongation at break in the MD and/or TD, such as about 2% or more, in some embodiments about 5% or more, in some embodiments from about 15% to about 50%, and in some embodiments, from about 15% to about 40%. Although possessing good strength and ductility, the film is not too stiff. One parameter that is indicative of the relative stiffness of the film is Young's modulus. For example, the film typically exhibits a Young's modulus in the MD of from about 10,000 to about 80,000 MPa, in some embodiments from about 12,000 to about 50,000 MPa, and in some embodiments, from about 15,000 to about 30,000 MPa, and a Young's modulus in the TD of from about 300 to about 10,000 MPa, in some embodiments from about 500 to about 5,000 MPa, and in some embodiments, from about 800 to about 3,000 MPa. The tensile properties described above may, for example, be determined in accordance with ASTM ISO 527-3:2018.

The resulting film can be formed into a laminate material having a variety of different uses, such as in claddings, multi-layer print wiring boards for semiconductor package and mother boards, flexible printed circuit board, tape automated bonding, tag tape, for electromagnetic waves, probe cables, communication equipment circuits, etc. In one particular embodiment, a laminate is employed in a flexible printed circuit board that contains at least one conductive layer and a film formed as described herein. The film may be positioned adjacent to at least conductive layer to form the laminate. The conductive layer may be provided in a variety of different forms, such as membranes, films, molds, wafers, tubes, etc. For example, the layer may have a foil-like structure in that it is relatively thin, such as having a thickness of about 500 micrometers or less, in some embodiments about 200 micrometers or less, and in some embodiments, from about 1 to about 100 micrometers. Of course, higher thicknesses may also be employed. The conductive layer may also contain a variety of conductive materials, such as a metal, e.g. gold, silver, nickel, aluminum, copper, as well as mixture or alloys thereof. In one embodiment, for instance, the conductive layer may include copper (e.g., pure copper and copper alloys).

The film may be applied to the conductive layer using techniques such as described above (e.g., casting), or the conductive layer may alternatively be applied to the film using techniques such as ion beam sputtering, high frequency sputtering, direct current magnetron sputtering, glow discharge, etc. If desired, the film may be subjected to a surface treatment on a side facing the conductive layer so that the adhesiveness between the film and conductive layer is improved. Examples of such surface treatments include, for instance, corona discharge treatment, UV irradiation treatment, plasma treatment, etc. When applied to a conductive layer, the film may be optionally annealed to improve its properties. For example, annealing may occur at a temperature of from about 250° C. to about 400° C., in some embodiments from about 260° C. to about 350° C., and in some embodiments, from about 280° C. to about 330° C., and for a time period ranging from about 15 minutes to about 300 minutes, in some embodiments from about 20 minutes to about 200 minutes, and in some embodiments, from about 30 minutes to about 120 minutes. During annealing, it is sometimes desirable to restrain the film at one or more locations (e.g., edges) so that it is not generally capable of physical movement. This may be accomplished in a variety of ways, such as by clamping, taping, or otherwise adhering the film to the conductive layer. Adhesives may also be employed between the film and the conductive layer as is known in the art. Suitable adhesives may include epoxy, phenol, polyester, nitrile, acryl, polyimide, polyurethane resins, etc.

Figure 6:
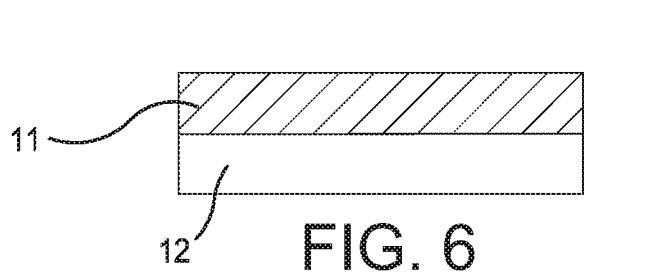
FIG. 6 is a schematic view of one embodiment of a laminate that can be formed according to the present invention.
Figure 7:
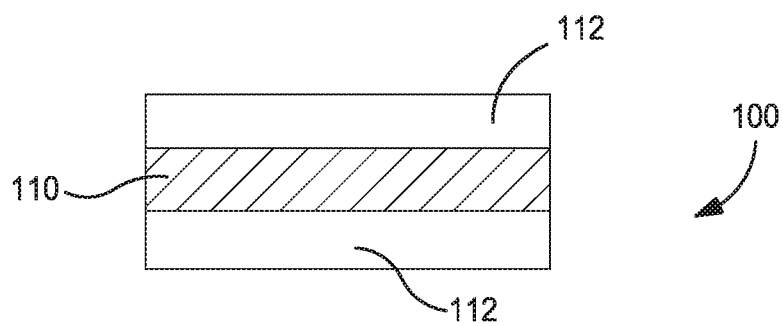
FIG. 7 is a schematic view of another embodiment of a laminate that can be formed according to the present invention.
Figure 8:
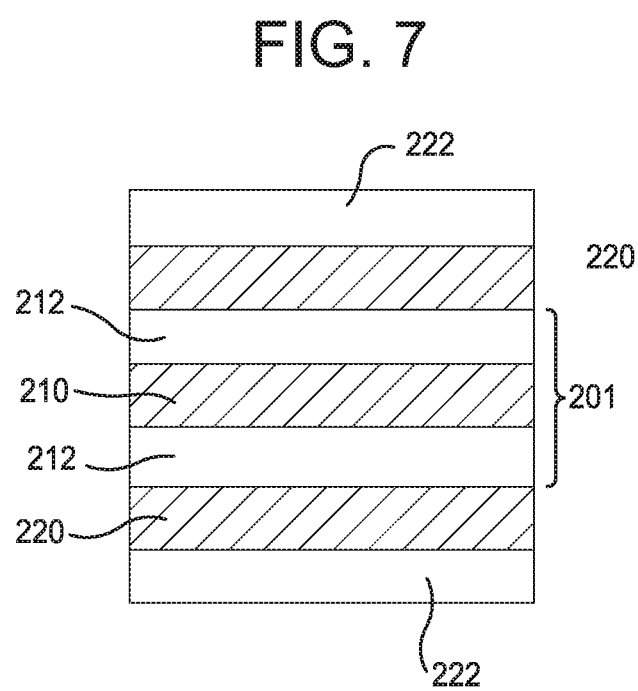
FIG. 8 is a schematic view of yet another embodiment of a laminate that can be formed according to the present invention.

The laminate may have a two-layer structure containing only the film and conductive layer. Referring to FIG. 6, for example, one embodiment of such a two layer structure 10 is shown as containing a film 11 positioned adjacent to a conductive layer 12 (e.g., copper foil). Alternatively, a multi-layered laminate may be formed that contains two or more conductive layers and/or two or more films. Referring to FIG. 7, for example, one embodiment of a three-layer laminate structure 100 is shown that contains a film 110 positioned between two conductive layers 112. Yet another embodiment is shown in FIG. 8. In this embodiment, a seven-layered laminate structure 200 is shown that contains a core 201 formed from a film 210 positioned between two conductive layers 212. Films 220 likewise overlie each of the conductive layers 212, respectively, and external conductive layers 222 overlie the films 220. In the embodiments described above, the film of the present invention may be used to form any, or even all of the film layers. Various conventional processing steps may be employed to provide the laminate with sufficient strength. For example, the laminate may be pressed and/or subjected to heat treatment as is known in the art.

IV. Applications

Figure 9:
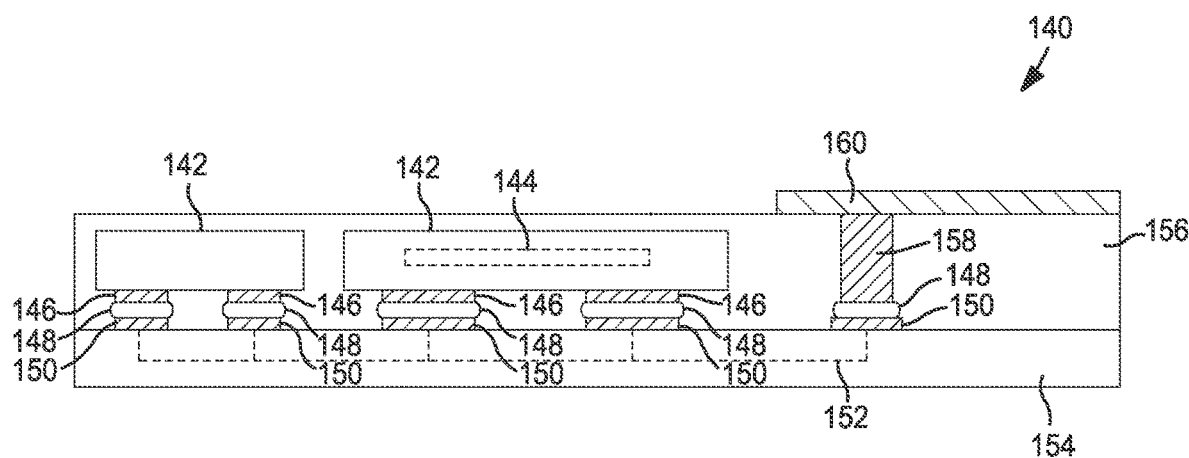
FIG. 9 is a schematic view of one embodiment of an electronic device that may be employ the circuit board of the present invention.

The laminate of the present invention may be employed in a wide variety of different applications. For example, as noted above, the laminate may be employed in a circuit board (e.g., printed circuit board) of an electronic device that is provided with antenna elements. The antenna elements may be applied (e.g., printed) directly onto the circuit board, or alternatively they may be provided in an antenna module that is supported by and connected to the circuit board. Referring to FIG. 9, for instance, one embodiment of an electronic device 140 is shown that contains a substrate 154 that supports various electrical components 142, such as integrated circuits (e.g., transceiver circuitry, control circuitry, etc.), discrete components (e.g., capacitors, inductors, resistors), switches, and so forth. An encapsulant material 156 may be be applied over the components 142 and a printed circuit board 154, such as described herein, that contains conductive traces 152 and contact pads 150 for forming electrical signal paths. A semiconductor die 144 may also be employed that is bonded to the printed circuit board and embedded within the package body to form each respective component 142. More particularly, the components 142 may have contacts 146 (e.g., solder pads) and may be mounted to contacts 150 on the printed circuit board 154 using a conductive material 148 (e.g., solder) coupled between contacts 146 and contacts 150. In the illustrated embodiment, antenna elements 160 are formed on an exposed surface of the encapsulant material 156. The antenna elements 156 may be electrically connected to the printed circuit board 154 via a transmission line 158 (e.g. metal post).

In certain embodiments, the printed circuit board is specifically configured for use in a 5G antenna system. As used herein, "5G" generally refers to high speed data communication over radio frequency signals. 5G networks and systems are capable of communicating data at much faster rates than previous generations of data communication standards (e.g., "4G, "LTE"). Various standards and specifications have been released quantifying the requirements of 5G communications. As one example, the International Telecommunications Union (ITU) released the International Mobile Telecommunications-2020 ("IMT-2020") standard in 2015. The IMT-2020 standard specifies various data transmission criteria (e.g., downlink and uplink data rate, latency, etc.) for 5G. The IMT-2020 Standard defines uplink and downlink peak data rates as the minimum data rates for uploading and downloading data that a 5G system must support. The IMT-2020 standard sets the downlink peak data rate requirement as 20 Gbit/s and the uplink peak data rate as 10 Gbit/s. As another example, $3^{rd}$ Generation Partnership Project (3GPP) recently released new standards for 5G, referred to as "5G NR." 3GPP published "Release 15" in 2018 defining "Phase 1" for standardization of 5G NR. 3GPP defines 5G frequency bands generally as "Frequency Range 1" (FR1) including sub-6 GHz frequencies and "Frequency Range 2" (FR2) as frequency bands ranging from 20-60 GHz. However, as used herein "5G frequencies" can refer to systems utilizing frequencies greater than 60 GHz, for example ranging up to 80 GHz, up to 150 GHz, and up to 300 GHz. As used herein, "5G frequencies" can refer to frequencies that are about 2.5 GHz or higher, in some embodiments about 3.0 GHz or higher, in some embodiments from about 3 GHz to about 300 GHz, or higher, in some embodiments from about 4 GHz to about 80 GHz, in some embodiments from about 5 GHz to about 80 GHz, in some embodiments from about 20 GHz to about 80 GHz, and in some embodiments from about 28 GHz to about 60 GHz.

5G antenna systems generally employ high frequency antennas and antenna arrays for use in base stations, repeaters (e.g., "femtocells"), relay stations, terminals, user devices, and/or other suitable components of 5G systems. The antenna elements/arrays and systems can satisfy or qualify as "5G" under standards released by 3GPP, such as Release 15 (2018), and/or the IMT-2020 Standard. To achieve such high speed data communication at high frequencies, antenna elements and arrays generally employ small feature sizes/spacing (e.g., fine pitch technology) and/or advanced materials that can improve antenna performance. For example, the feature size (spacing between antenna elements, width of antenna elements) etc. is generally dependent on the wavelength ("λ") of the desired transmission and/or reception radio frequency propagating through the circuit board on which the antenna element is formed (e.g., nλ/4 where n is an integer). Further, beamforming and/or beam steering can be employed to facilitate receiving and transmitting across multiple frequency ranges or channels (e.g., multiple-in-multiple-out (MIMO), massive MIMO). The high frequency 5G antenna elements can have a variety of configurations. For example, the 5G antenna elements can be or include co-planar waveguide elements, patch arrays (e.g., mesh-grid patch arrays), other suitable 5G antenna configurations. The antenna elements can be configured to provide MIMO, massive MIMO functionality, beam steering, etc. As used herein "massive" MIMO functionality generally refers to providing a large number transmission and receiving channels with an antenna array, for example 8 transmission (Tx) and 8 receive (Rx) channels (abbreviated as 8×8). Massive MIMO functionality may be provided with 8×8, 12×12, 16×16, 32×32, 64×64, or greater.

The antenna elements may be fabricated using a variety of manufacturing techniques. As one example, the antenna elements and/or associated elements (e.g., ground elements, feed lines, etc.) can employ fine pitch technology. Fine pitch technology generally refers to small or fine spacing between their components or leads. For example, feature dimensions and/or spacing between antenna elements (or between an antenna element and a ground plane) can be about 1,500 micrometers or less, in some embodiments 1,250 micrometers or less, in some embodiments 750 micrometers or less (e.g., center-to-center spacing of 1.5 mm or less), 650 micrometers or less, in some embodiments 550 micrometers or less, in some embodiments 450 micrometers or less, in some embodiments 350 micrometers or less, in some embodiments 250 micrometers or less, in some embodiments 150 micrometers or less, in some embodiments 100 micrometers or less, and in some embodiments 50 micrometers or less. However, it should be understood that feature sizes and/or spacings that are smaller and/or larger may also be employed. As a result of such small feature dimensions, antenna configurations and/or arrays can be achieved with a large number of antenna elements in a small footprint. For example, an antenna array can have an average antenna element concentration of greater than 1,000 antenna elements per square centimeter, in some embodiments greater than 2,000 antenna elements per square centimeter, in some embodiments greater than 3,000 antenna elements per square centimeter, in some embodiments greater than 4,000 antenna elements per square centimeter, in some embodiments greater than 6,000 antenna elements per square centimeter, and in some embodiments greater than about 8,000 antenna elements per square centimeter. Such compact arrangement of antenna elements can provide a greater number of channels for MIMO functionality per unit area of the antenna area. For example, the number of channels can correspond with (e.g., be equal to or proportional with) the number of antenna elements.

Referring to FIG. 1, for example, a 5G antenna system 100 can include a base station 102, one or more relay stations 104, one or more user computing devices 106, one or more Wi-Fi repeaters 108 (e.g., "femtocells"), and/or other suitable antenna components for the 5G antenna system 100. The relay stations 104 can be configured to facilitate communication with the base station 102 by the user computing devices 106 and/or other relay stations 104 by relaying or "repeating" signals between the base station 102 and the user computing devices 106 and/or relay stations 104. The base station 102 can include a MIMO antenna array 110 configured to receive and/or transmit radio frequency signals 112 with the relay station(s) 104, Wi-Fi repeaters 108, and/or directly with the user computing device(s) 106. The user computing device 106 is not necessarily limited by the present invention and include devices such as 5G smartphones.

The MIMO antenna array 110 can employ beam steering to focus or direct radio frequency signals 112 with respect to the relay stations 104. For example, the MIMO antenna array 110 can be configured to adjust an elevation angle 114 with respect to an X-Y plane and/or a heading angle 116 defined in the Z-Y plane and with respect to the Z direction. Similarly, one or more of the relay stations 104, user computing devices 106, Wi-Fi repeaters 108 can employ beam steering to improve reception and/or transmission ability with respect to MIMO antenna array 110 by directionally tuning sensitivity and/or power transmission of the device 104, 106, 108 with respect to the MIMO antenna array 110 of the base station 102 (e.g., by adjusting one or both of a relative elevation angle and/or relative azimuth angle of the respective devices).

Figure 2A:
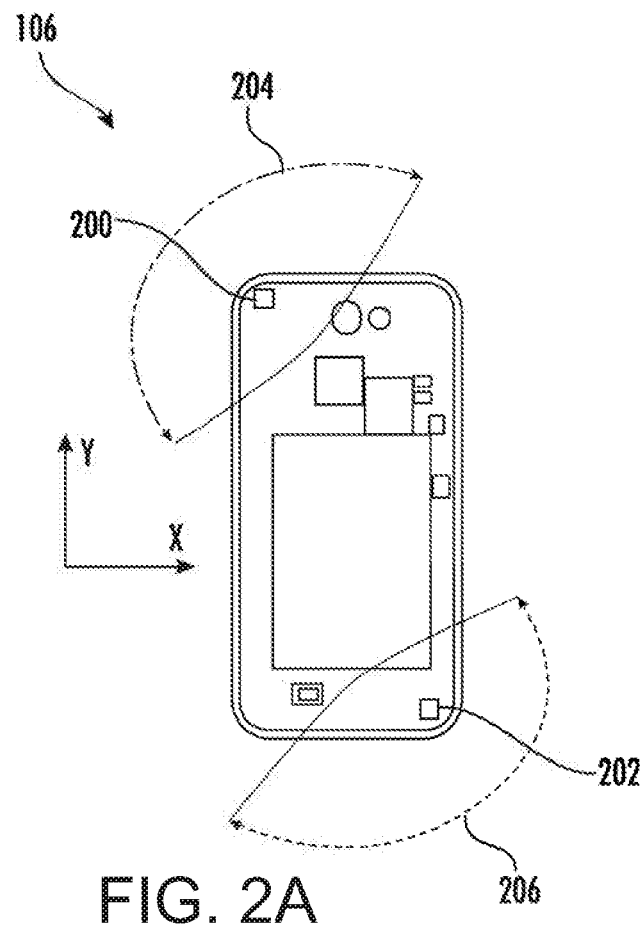
FIG. 2A illustrates a top-down view of an example user computing device including 5G antennas.
Figure 2B:
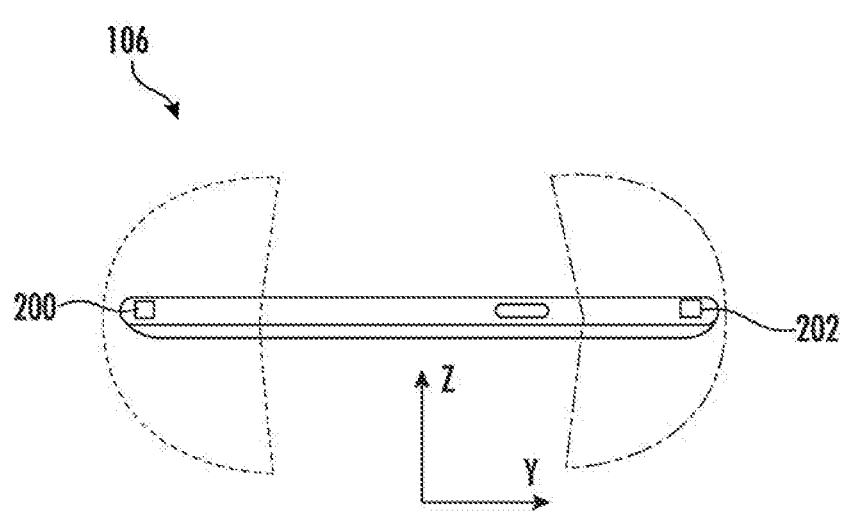
FIG. 2B illustrates a side elevation view of the example user computing device of FIG. 2A.

FIGS. 2A-2B likewise illustrate a top-down and side elevation view, respectively, of an example user computing device 106. The user computing device 106 may include one or more antenna elements 200, 202 (e.g., arranged as respective antenna arrays). Referring to FIG. 2A, the antenna elements 200, 202 can be configured to perform beam steering in the X-Y plane (as illustrated by arrows 204, 206 and corresponding with a relative azimuth angle). Referring to FIG. 2B, the antenna elements 200, 202 can be configured to perform beam steering in the Z-Y plane (as illustrated by arrows 204, 206).

Figure 3:
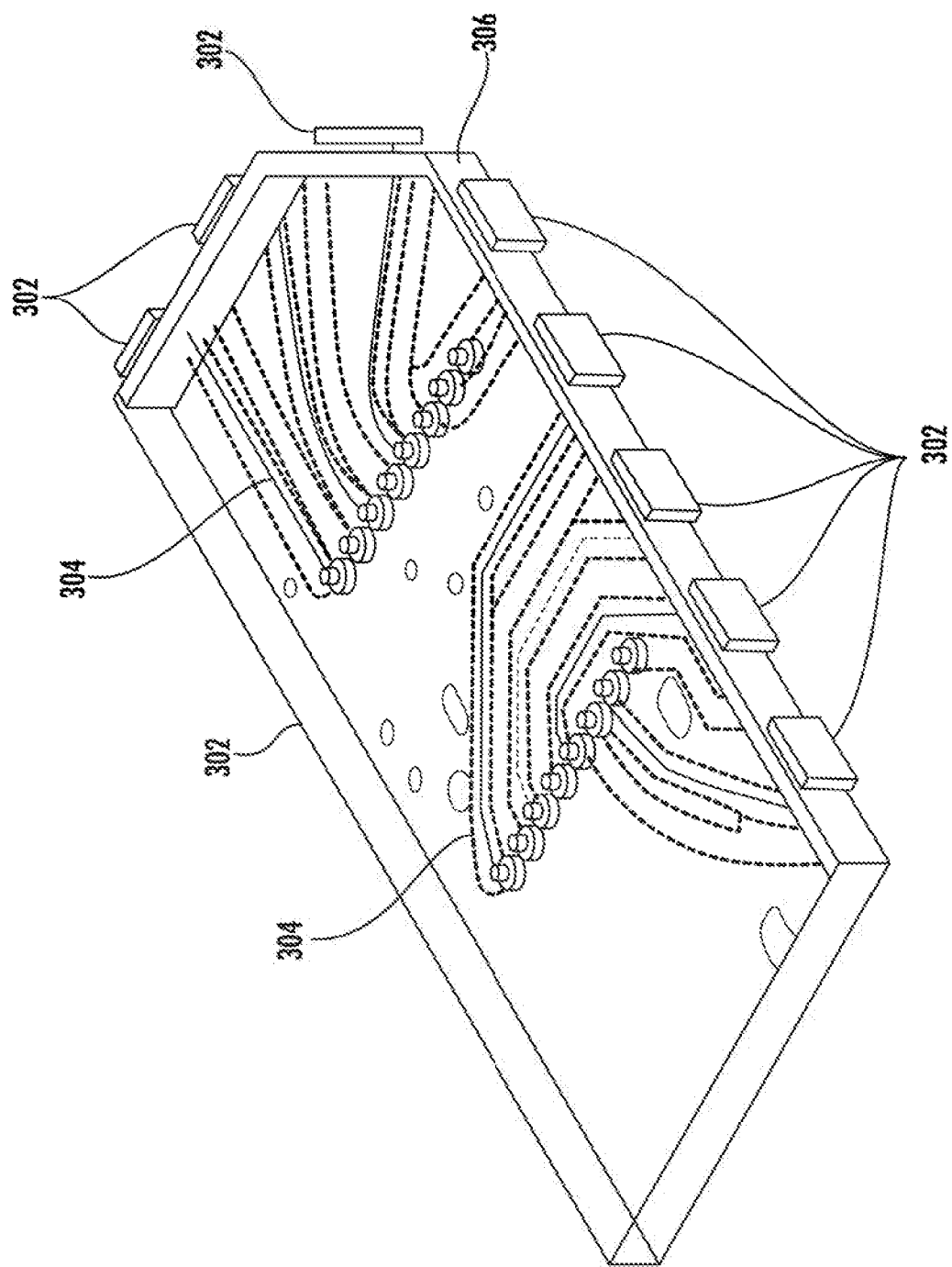
FIG. 3 illustrates an enlarged view of a portion of the user computing device of FIG. 2A.

FIG. 3 depicts a simplified schematic view of a plurality of antenna arrays 302 connected using respective feed lines 304 (e.g., with a front end module). The antenna arrays 302 can be mounted to a side surface 306 of the substrate 308, such as described and illustrated with respect to FIGS. 4A through 4C. The substrate 308 may be a circuit board such as described herein. The antenna arrays 302 can include a plurality of vertically connected elements (e.g., as a mesh-grid array). Thus, the antenna array 302 can generally extend parallel with the side surface 306 of the substrate 308. Shielding can optionally be provided on the side surface 306 of the substrate 308 such that the antenna arrays 302 are located outside of the shielding with respect to the substrate 308. The vertical spacing distance between the vertically connected elements of the antenna array 302 can correspond with the "feature sizes" of the antenna arrays 302. As such, in some embodiments, these spacing distances may be relatively small (e.g., less than about 750 micrometers) such that the antenna array 302 is a "fine pitch" antenna array 302.

Figure 4:
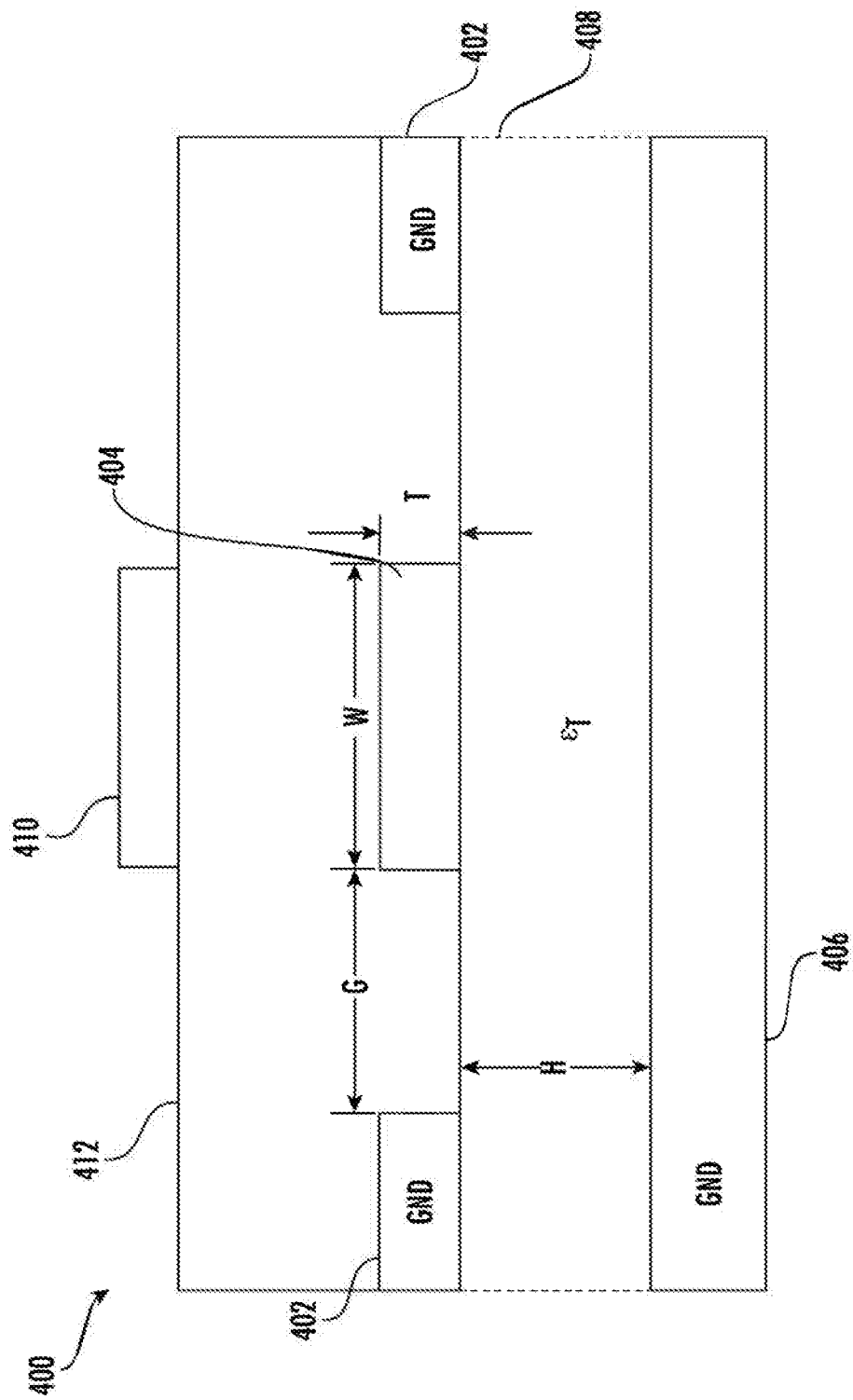
FIG. 4 illustrates a side elevation view of co-planar waveguide antenna array configuration that can be employed in a 5G antenna system.

FIG. 4 illustrates a side elevation view of a co-planar waveguide antenna 400 configuration. One or more co-planar ground layers 402 can be arranged parallel with an antenna element 404 (e.g., a patch antenna element). Another ground layer 406 may be spaced apart from the antenna element by a substrate 408, which may be a circuit board such as described herein. One or more additional antenna elements 410 can be spaced apart from the antenna element 404 by a second layer or substrate 412, which may be a circuit board as described herein. The dimensions "G" and "W" may correspond with "feature sizes" of the antenna 400. The "G" dimension may correspond with a distance between the antenna element 404 and the co-planar ground layer(s) 406. The "W" dimension can correspond with a width (e.g., linewidth) of the antenna element 404. As such, in some embodiments, dimensions "G" and "W" may be relatively small (e.g., less than about 750 micrometers) such that the antenna 400 is a "fine pitch" antenna 400.

Figure 5A:
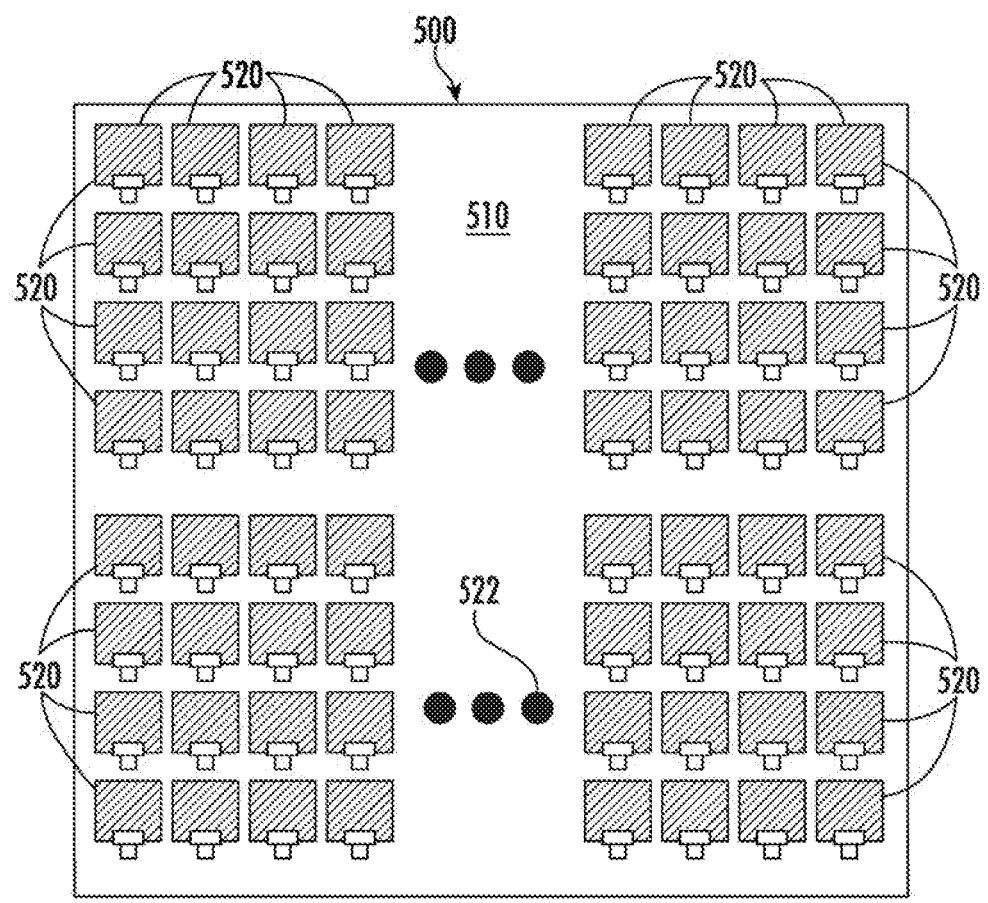
FIG. 5A illustrates an antenna array for massive multiple-in-multiple-out configurations of a 5G antenna system.

FIG. 5A illustrates one embodiment of an antenna array 500. The antenna array 500 can include a substrate 510 and a plurality of antenna elements 520 formed thereon. The substrate 510 may be a circuit board such as described herein. The plurality of antenna elements 520 can be approximately equally sized in the X- and/or Y-directions (e.g., square or rectangular). The plurality of antenna elements 520 can be spaced apart approximately equally in the X- and/or Y-directions. The dimensions of the antenna elements 520 and/or spacing therebetween can correspond with "feature sizes" of the antenna array 500. As such, in some embodiments, the dimensions and/or spacing may be relatively small (e.g., less than about 750 micrometers) such that the antenna array 500 is a "fine pitch" antenna array 500. As illustrated by the ellipses 522, the number of columns of antenna elements 520 illustrated in FIG. 5 is provided as an example only. Similarly, the number of rows of antenna element 520 is provided as an example only.

The tuned antenna array 500 can be used to provide massive MIMO functionality, for example in a base station (e.g., as described above with respect to FIG. 1). More specifically, radio frequency interactions between the various elements can be controlled or tuned to provide multiple transmitting and/or receiving channels. Transmitting power and/or receiving sensitivity can be directionally controlled to focus or direct radio frequency signals, for example as described with respect to the radio frequency signals 112 of FIG. 1. The tuned antenna array 500 can provide a large number of antenna elements 522 in a small footprint. For example, the tuned antenna 500 can have an average antenna element concentration of 1,000 antenna elements per square cm or greater. Such compact arrangement of antenna elements can provide a greater number of channels for MIMO functionality per unit area. For example, the number of channels can correspond with (e.g., be equal to or proportional with) the number of antenna elements.

Figure 5C:
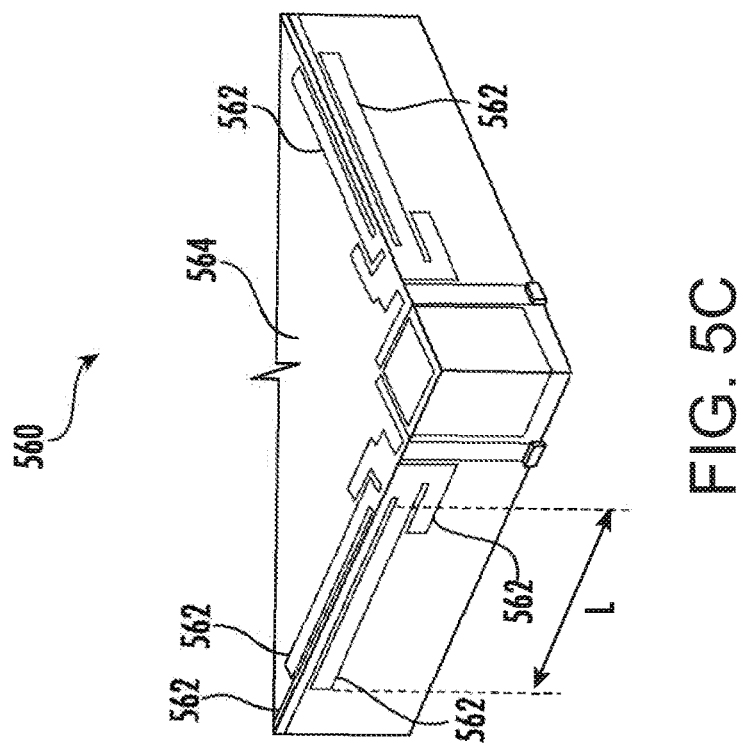
FIG. 5C illustrates an example antenna configuration that can be employed in a 5G antenna system.
Figure 5B:
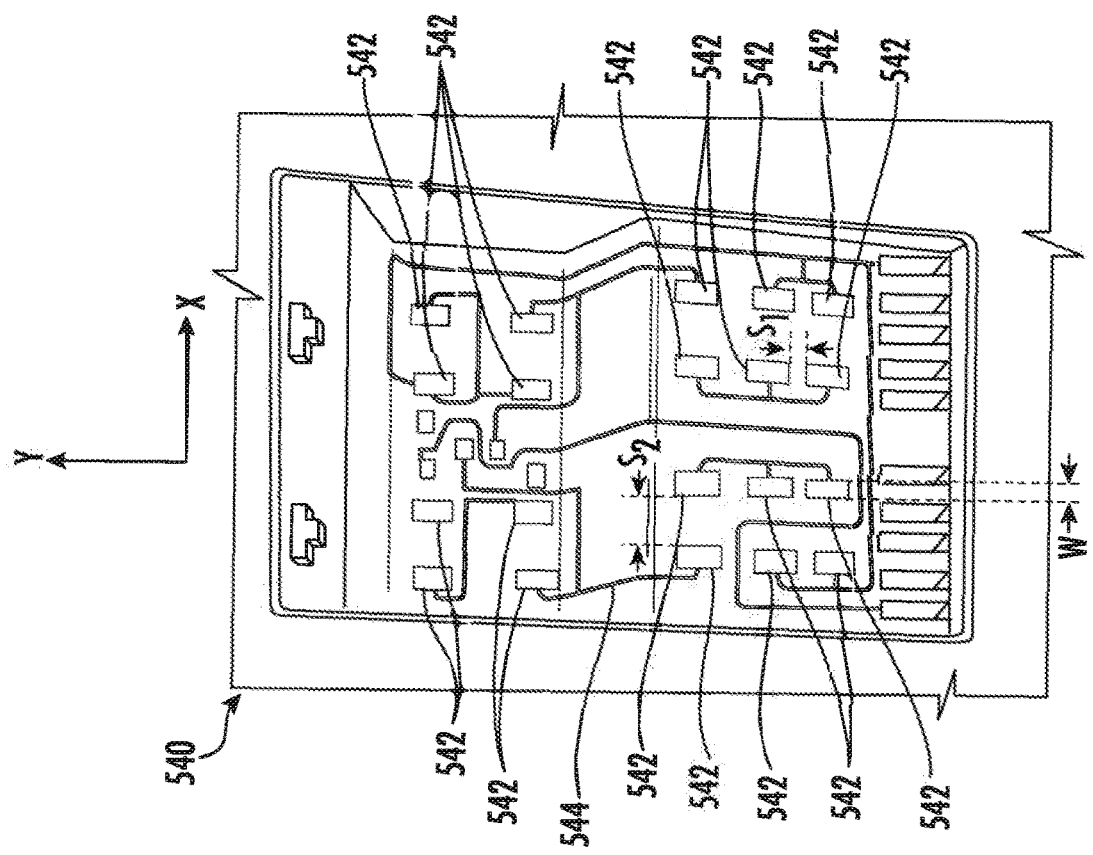
FIG. 5B illustrates an antenna array formed that can be employed in a 5G antenna system.

FIG. 5B illustrates an embodiment of an antenna array 540. The antenna array 540 can include a plurality of antenna elements 542 and plurality of feed lines 544 connecting the antenna elements 542 (e.g., with other antenna elements 542, a front end module, or other suitable component). The antenna elements 542 can have respective widths "w" and spacing distances "$S_1$," and "$S_2$" therebetween (e.g., in the X-direction and Y-direction, respectively). These dimensions can be selected to achieve 5G radio frequency communication at a desired 5G frequency. More specifically, the dimensions can be selected to tune the antenna array 540 for transmission and/or reception of data using radio frequency signals that are within the 5G frequency spectrum (e.g., greater the 2.5 GHz and/or greater than 3 GHz and/or greater than 28 GHz). The dimensions can be selected based on the material properties of the substrate, which may be the circuit board of the present invention. For example, one or more of "w", "$S_1$," or "$S_2$" can correspond with a multiple of a propagation wavelength ("λ") of the desired frequency through the substrate material (e.g., nλ/4 where n is an integer).

As one example, λ can be calculated as follows:

$$\Lambda = \frac{c}{f\sqrt{\epsilon_R}}$$

where c is the speed of light in a vacuum, $\epsilon_R$ is the dielectric constant of the substrate (or surrounding material), f is the desired frequency.

FIG. 5C illustrates an example antenna configuration 560 according to aspects of the present invention. The antenna configuration 560 can include multiple antenna elements 562 arranged in parallel long edges of a substrate 564. The various antenna elements 562 can have respective lengths, "L" (and spacing distances therebetween) that tune the antenna configuration 560 for reception and/or transmission at a desired frequency and/or frequency range. More specifically, such dimensions can be selected based on a propagation wavelength, λ, at the desired frequency for the substrate material, for example as described above with reference to FIG. 5B.

The present invention may be better understood with reference to the following examples.

Test Methods

Melt Viscosity: The melt viscosity (Pa-s) may be determined in accordance with ISO Test No. 11443:2005 at a shear rate of 1,000 s⁻¹ and temperature 15° C. above the melting temperature (e.g., about 350° C.) using a Dynisco LCR7001 capillary rheometer. The rheometer orifice (die) had a diameter of 1 mm, length of 20 mm, L/D ratio of 20.1, and an entrance angle of 180°. The diameter of the barrel was 9.55 mm+0.005 mm and the length of the rod was 233.4 mm.

Melting Temperature: The melting temperature ("Tm") may be determined by differential scanning calorimetry ("DSC") as is known in the art. The melting temperature is the differential scanning calorimetry (DSC) peak melt temperature as determined by ISO Test No. 11357-2:2013. Under the DSC procedure, samples were heated and cooled at 20° C. per minute as stated in ISO Standard 10350 using DSC measurements conducted on a TA Q2000 Instrument.

Deflection Temperature Under Load ("DTUL"): The deflection under load temperature may be determined in accordance with ISO Test No. 75-2:2013 (technically equivalent to ASTM D648-07). More particularly, a test strip sample having a length of 80 mm, thickness of 10 mm, and width of 4 mm may be subjected to an edgewise three-point bending test in which the specified load (maximum outer fibers stress) was 1.8 Megapascals. The specimen may be lowered into a silicone oil bath where the temperature is raised at 2° C. per minute until it deflects 0.25 mm (0.32 mm for ISO Test No. 75-2:2013).

Tensile Modulus, Tensile Stress, and Tensile Elongation: Tensile properties may be tested according to ISO Test No. 527:2012 (technically equivalent to ASTM D638-14). Modulus and strength measurements may be made on the same test strip sample having a length of 80 mm, thickness of 10 mm, and width of 4 mm. The testing temperature may be about 23° C., and the testing speeds may be 1 or 5 mm/min.

Flexural Modulus, Flexural Stress, and Flexural Elongation: Flexural properties may be tested according to ISO Test No. 178:2010 (technically equivalent to ASTM D790-10). This test may be performed on a 64 mm support span. Tests may be run on the center portions of uncut ISO 3167 multi-purpose bars. The testing temperature may be about 23° C. and the testing speed may be 2 mm/min.

Notched Charpy Impact Strength: Charpy properties may be tested according to ISO Test No. ISO 179-1:2010) (technically equivalent to ASTM D256-10, Method B). This test may be run using a Type 1 specimen size (length of 80 mm, width of 10 mm, and thickness of 4 mm). When testing the notched impact strength, the notch may be a Type A notch (0.25 mm base radius). Specimens may be cut from the center of a multi-purpose bar using a single tooth milling machine. The testing temperature may be about 23° C.

Dielectric Constant ("Dk") and Dissipation Factor ("Df"): The dielectric constant (or relative static permittivity) and dissipation factor are determined according to IEC 60250: 1969. Such techniques are also described in Baker-Jarvis, et al., IEEE Trans. on *Dielectric and Electrical Insulation*, 5(4), p. 571 (1998) and Krupka, et al., *Proc. 7th International Conference on Dielectric Materials: Measurements and Applications, IEEE Conference Publication No.* 430 (September 1996). More particularly, a plaque sample having a size of 80 mm×80 mm×1 mm was inserted between two fixed dielectric resonators. The resonator measures the permittivity component in the plane of the specimen. Five (5) samples may be tested and the average value is recorded.

Example 1

Samples 1-3 are extruded into a film for use in a printed circuit board. Sample 1 contained 100 wt. % LCP 1, which is formed from 73% HBA and 27% HNA. Sample 2 contained 100 wt. % LCP 2, which is formed from 79.3% HBA, 20% HNA, and 0.7% TA. Sample 3 contained 75 wt. % LCP 1 and 25 wt. % PTFE. Samples 1-3 were tested for thermal and mechanical properties. The results are set forth below.

|  | Sample 1 | Sample 2 | Sample 3 |
|---|---|---|---|
| Dk @ 10 GHz | 3.42 | 3.36 | 3.12 |
| Df @ 10 GHz | 0.0017 | 0.0017 | 0.0016 |
| Melting Point (° C.) | 280 | 325 | 280 |
| Tensile strength (MPa) | 148 | 150 | 156 |
| Tensile modulus (MPa) | 7,800 | 8,200 | 7,000 |
| Tensile elongation (%) | 5.7 | 3.7 | 6.2 |
| Flexural strength (MPa) | 158 | 145 | 125 |
| Flexural modulus (MPa) | 9,100 | 7,300 | 7,100 |
| DTUL at 1.8 MPa | 193 | 175 | 165 |

Example 2

Samples 4-6 are extruded into a film for use in a printed circuit board. Sample 4 contained 80 wt. % LCP 3 and 20 wt. % PTFE, Sample 5 contained 75 wt. % LCP 3 and 20 wt. % PTFE, and Sample 6 contained 75 wt. % LCP 2 and 25 wt. % PTFE. LCP 3 is formed from 43% HBA, 9% TA, 29% HQ, and 20% NDA. Also, the PTFE had a D50 particle size of 4 μm and a D90 particle size of 15 μm. Samples 4-6 were tested for thermal and mechanical properties. The results are set forth below.

|  | Sample 4 | Sample 5 | Sample 6 |
|---|---|---|---|
| Dk @ 10 GHz | 3.10 | 3.06 | 3.13 |
| Df @ 10 GHz | 0.0013 | 0.0013 | 0.0017 |
| Melt Viscosity (1,000 s$^{-1}$ at 340° C.) | 59.6 | 49.8 | 48.0 |
| Tensile strength (MPa) | 8,637 | 8,120 | 7,085 |
| Tensile modulus (MPa) | 155.5 | 152.83 | 115.9 |
| Tensile elongation (%) | 2.18 | 2.67 | 2.47 |
| Flexural strength (MPa) | 9,393 | 8,701 | 8,032 |
| Flexural modulus (MPa) | 152.92 | 144.11 | 126.92 |
| DTUL at 1.8 MPa | 251 | 247 | 185 |

Example 3

Samples 6-8 are extruded into a film for use in a printed circuit board. Sample 6 contained 80 wt. % LCP 5 and 20 wt. % PTFE, Sample 7 contained 75 wt. % LCP 5 and 25 wt. % PTFE 1, and Sample 8 contained 75 wt. % LCP 4 and 25 wt. % PTFE. LCP 5 is formed from 43% HBA, 9% TA, 29% HQ, and 20% NDA. Also, the PTFE 1 had a D50 particle size of 4 μm and a D90 particle size of 15 μm. Samples 6-8 were tested for thermal and mechanical properties. The results are set forth below.

|  | Sample 6 | Sample 7 | Sample 8 |
|---|---|---|---|
| Dk @ 10 GHz | 3.10 | 3.06 | 3.13 |
| Df @ 10 GHz | 0.0013 | 0.0013 | 0.0017 |
| Dk @ 2 GHz | 3.04 | 3.01 | — |
| Df @ 2 GHz | 0.0017 | 0.0017 | — |
| Melt Viscosity (1,000 s$^{-1}$ at 340° C.) | 59.6 | 49.8 | 48.0 |
| Tensile strength (MPa) | 8,637 | 8,120 | 7,085 |
| Tensile modulus (MPa) | 155.5 | 152.83 | 115.9 |
| Tensile elongation (%) | 2.18 | 2.67 | 2.47 |
| Flexural strength (MPa) | 9,393 | 8,701 | 8,032 |
| Flexural modulus (MPa) | 152.92 | 144.11 | 126.92 |
| DTUL at 1.8 MPa | 251 | 247 | 185 |
| Charpy Notched Strength (kJ/m$^2$) | 61 | 63 | — |

Example 4

Samples 9-15 are formed from various combinations of liquid crystalline polymers (LCP 1 and LCP 5), copper chromite filler (CuCr$_2$O$_4$), glass fibers, alumina trihydrate ("ATH"), lubricant (polyethylene wax), and polytetrafluoroethylene ("PTFE 1" or "PTFE 2"). PTFE 2 is a powder of polytetrafluoroethylene particles having a D50 particle size of 40 μm.

TABLE 1

|  | 9 | 10 | 11 | 12 | 13 | 14 | 15 |
|---|---|---|---|---|---|---|---|
| LCP 5 | 77.6 | 78 | 80 | 73 | 68 | 73 | 68 |
| LCP 1 | 17.6 | — | — | — | — | — | — |
| Glass Fibers | 15 | 15 | 13 | 15 | 15 | 15 | 15 |
| Alumina Trihydrate | 0.2 | 0.2 | 0.2 | 0.2 | 0.2 | 0.2 | 0.2 |
| Lubricant | 0.2 | 0.2 | 0.2 | 0.2 | 0.2 | 0.2 | 0.2 |
| Copper Chromite | 4.4 | 6.6 | 6.6 | 6.6 | 6.6 | 6.6 | 6.6 |
| PTFE 1 | — | — | — | 5 | 10 | — | — |
| PTFE 2 | — | — | — | — | — | 5 | 10 |

Samples 9-15 were tested for thermal and mechanical properties. The results are set forth below in Table 2.

TABLE 2

| Sample | 9 | 10 | 11 | 12 | 13 | 14 | 15 |
|---|---|---|---|---|---|---|---|
| Dielectric Constant (2 GHz) | 3.73 | 3.69 | 3.64 | 3.66 | 3.6 | 3.7 | 3.6 |
| Dissipation Factor (2 GHz) | 0.0056 | 0.0036 | 0.0035 | 0.0042 | 0.0038 | 0.0036 | 0.004 |
| DTUL at 1.8 MPa (° C.) | 239 | 282 | 278 | 258 | 277 | 277 | 270 |
| Charpy Notched (kJ/m$^2$) | 51 | 45 | 52 | 68 | 53 | 44 | 19 |
| Charpy Unnotched (kJ/m$^2$) | 58 | 57 | 60 | 80 | 77 | 55 | 36 |
| Tensile Strength (MPa) | 134 | 142 | 140 | 129 | 113 | 164 | 126 |
| Tensile Modulus (MPa) | 10,547 | 12,090 | 11,880 | 8,971 | 10,026 | 12,666 | 12,359 |
| Tensile Elongation (%) | 3.08 | 2.56 | 2.58 | 3.74 | 2.98 | 2.82 | 1.7 |
| Flexural Strength (MPa) | 158 | 189 | 189 | 140 | 143 | 191 | 174 |
| Flexural Modulus (MPa) | 9,834 | 10,601 | 10,510 | 8,725 | 9,921 | 11,314 | 11,061 |
| Flexural Elongation (%) | >3.5 | >3.5 | >3.5 | >3.5 | >3.5 | 3.24 | 3.33 |
| Melt Viscosity (Pa-s) at 1,000 s$^{-1}$ | 24 | 36 | 37 | 30 | 44 | 44 | 62 |
| Melting Temperature (° C., 1$^{st}$ heat of DSC) | 309.98 | 320.26 | 320.58 | 324.25 | 324.65 | 320.76 | 322.95 |

Example 5

Samples 16-17 are formed from various combinations of liquid crystalline polymers (LCP 6 and LCP 7) and PTFE 1. LCP 6 is formed from 76% HNA and 24% HBA. LCP 7 is formed from 62% HNA, 2% HBA, 18% TA, and 18% BP. Compounding was performed using an 18-mm single screw extruder. Parts are injection molded the samples into plaques (60 mm×60 mm).

|        | 16 | 17 |
|--------|----|----|
| LCP 6  | 75 | —  |
| LCP 7  | —  | 75 |
| PTFE 1 | 25 | 25 |

Samples 16-17 were tested for thermal and mechanical properties. The results are set forth below in Table 3.

TABLE 3

| Sample | 16 | 17 |
|--------|----|----|
| Dielectric Constant (2 GHz) | 3.18 | 3.17 |
| Dissipation Factor (2 GHz) | 0.0010 | 0.0006 |
| DTUL at 1.8 MPa (° C.) | 201 | 306 |
| Charpy Notched (kJ/m$^2$) | 54 | 10 |
| Tensile Strength (MPa) | 127 | — |
| Tensile Modulus (MPa) | 5,900 | — |
| Tensile Elongation (%) | 3.5 | — |
| Flexural Strength (MPa) | 135 | 137 |
| Flexural Modulus (MPa) | 7,000 | 14,000 |

Example 6

Samples 18-19 may be extruded into a film for use in a printed circuit board. Sample 18 contains 70 wt. % LCP 5 and 30 wt. % PTFE 1 and Sample 19 contains 65 wt. % LCP 5 and 35% wt. % PTFE 1. Samples 18-19 were tested for thermal and mechanical properties. The results are set forth below.

|        | 18 | 19 |
|--------|----|----|
| Dk @ 10 GHz | 3.03 | 2.97 |
| Df @ 10 GHz | 0.0013 | 0.0013 |
| Melt Viscosity (1,000 s$^{-1}$ at 340° C.) | 39.0 | 39.5 |
| Tensile strength (MPa) | 141 | 106 |
| Tensile modulus (MPa) | 7,028 | 6,339 |
| Tensile elongation (%) | 3.15 | 2.43 |
| Flexural strength (MPa) | 125 | 112 |
| Flexural modulus (MPa) | 7,435 | 6,832 |
| DTUL at 1.8 MPa | 248.4 | 246.8 |
| Charpy Notched Strength (kJ/m$^2$) | 59.2 | 51.7 |

These and other modifications and variations of the present invention may be practiced by those of ordinary skill in the art, without departing from the spirit and scope of the present invention. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

What is claimed is:

1. A laminate for use in a circuit board, the laminate comprising:
   a conductive layer; and
   a film positioned adjacent to the conductive layer, wherein the film comprises a polymer composition that includes a polymer matrix comprising a liquid crystalline polymer and a hydrophobic material distributed throughout the polymer matrix, wherein the polymer composition exhibits a dielectric constant of about 5 or less and dissipation factor of about 0.05 or less at a frequency of 10 GHz, wherein the liquid crystalline polymer contains repeating units derived from 6-hydroxy-2-naphthoic acid in an amount of about 30 mol. % or more.

2. The laminate of claim 1, wherein the film is positioned between two conductive layers.

3. The laminate of claim 1, wherein the film has a thickness of about 500 micrometers or less.

4. The laminate of claim 1, wherein the film is formed by melt-extruding the polymer composition onto the conductive layer.

5. The laminate of claim 1, wherein the conductive layer comprises copper or an alloy thereof.

6. The laminate of claim 1, wherein the polymer composition has a melting temperature of from about 200° C. to about 400° C.

7. The laminate of claim 1, wherein liquid crystalline polymers constitute from about 40 wt. % to about 99 wt. % of the polymer composition.

8. The laminate of claim 1, wherein the liquid crystalline polymer contains repeating units derived from one or more aromatic dicarboxylic acids.

9. The laminate of claim 1, wherein the liquid crystalline further comprises repeating units derived from 4-hydroxybenzoic acid.

10. The laminate of claim 8, wherein the aromatic hydroxycarboxylic acids include terephthalic acid, isophthalic acid, 2,6-naphthalenedicarboxylic acid, or a combination thereof.

11. The laminate of claim 8, wherein the liquid crystalline polymer further contains repeating units derived from one or more aromatic diols.

12. The laminate of claim 11, wherein the aromatic diols include hydroquinone, 4,4'-biphenol, or a combination thereof.

13. The laminate of claim 1, wherein the liquid crystalline polymer is wholly aromatic.

14. The laminate of claim 1, wherein the liquid crystalline polymer contains repeating units derived from 6-hydroxy-2-naphthoic acid in an amount of about 50 mol. % or more.

15. The laminate of claim 1, wherein the liquid crystalline polymer contains repeating units derived from 6-hydroxy-2-naphthoic acid in an amount of about 70 mol. % or more.

16. The laminate of claim 1, wherein the liquid crystalline polymer contains repeating units derived from 6-hydroxy-2-naphthoic acid and 4-hydroxybenzoic acid in a molar ratio of from about 0.1 to about 40.

17. The laminate of claim 1, wherein the liquid crystalline polymer contains repeating units derived from 6-hydroxy-2-naphthoic acid and 4-hydroxybenzoic acid in a molar ratio of from about 1 to about 5.

18. The laminate of claim 1, wherein the liquid crystalline polymer contains repeating units derived from 2,6-naphthalenedicarboxylic acid in an amount of about 10 mol. % or more.

19. The laminate of claim 1, wherein the weight ratio of liquid crystalline polymers to the hydrophobic material is from about 1 to about 20.

20. The laminate of claim 1, wherein the hydrophobic material includes a fluoropolymer.

21. The laminate of claim 20, wherein the fluoropolymer includes polytetrafluoroethylene, perfluoroalkylvinyl ether, poly(tetrafluoroethylene-co-perfluoroalkyvinyl ether), fluorinated ethylene-propylene copolymer, ethylene-tetrafluoroethylene copolymer, polyvinylidene fluoride, polychlorotrifluoroethylene, and copolymers and/or mixtures thereof.

22. The laminate of claim 1, wherein the fluoropolymer and the liquid crystalline polymer are melt processed as a mixture to form the polymer composition.

23. The laminate of claim 1, wherein the liquid crystalline polymer is formed by polymerization of one or more aromatic precursor monomers in the presence of the hydrophobic material.

24. The laminate of claim 1, wherein the hydrophobic material has an average particle size of from about 1 to about 60 micrometers.

25. The laminate of claim 1, wherein the polymer composition exhibits a dielectric constant of about 4 or less at a frequency of 10 GHz.

26. A circuit board comprising the laminate of claim 1.

27. A 5G antenna system comprising a circuit board and at least one antenna element configured to transmit and receive 5G radio frequency signals, wherein the antenna element is coupled to the circuit board, wherein the circuit board comprises a laminate comprising a conductive layer and a film positioned adjacent to the conductive layer, wherein the film comprises a polymer composition that includes a polymer matrix comprising a liquid crystalline polymer and a hydrophobic material distributed throughout the polymer matrix, wherein the polymer composition exhibits a dielectric constant of about 5 or less and dissipation factor of about 0.05 or less at a frequency of 10 GHz.

28. The 5G antenna system of claim 27, wherein the antenna element has a feature size that is less than about 1,500 micrometers.

29. The 5G antenna system of claim 27, wherein the 5G radio frequency signals have a frequency that is greater than about 28 GHz.

30. The 5G antenna system of claim 27, wherein the at least one antenna element comprises a plurality of antenna elements arranged in an antenna array.

31. The 5G antenna system of claim 30, wherein the plurality of antenna elements are spaced apart by a spacing distance that is less than about 1,500 micrometers.

32. The 5G antenna system of claim 30, wherein the plurality of antenna elements comprise at least 16 antenna elements.

33. The 5G antenna system of claim 30, wherein the plurality of antenna elements are arranged in a grid.

34. The 5G antenna system of claim 30, wherein the antenna array is configured for at least 8 transmission channels and at least 8 reception channels.

35. The 5G antenna system of claim 30, wherein the antenna array has an average antenna element concentration of greater than 1,000 antenna elements per square centimeter.

36. The 5G antenna system of claim 27, further comprising a base station, and wherein the base station comprises the antenna element.

37. The 5G antenna system of claim 27, further comprising at least one of a user computing device or a repeater, and wherein the at least one of the user computing device or the repeater base station comprises the antenna element.

* * * * *